(12) United States Patent
Kim et al.

(10) Patent No.: US 12,376,464 B2
(45) Date of Patent: Jul. 29, 2025

(54) DISPLAY DEVICE

(71) Applicant: SAMSUNG DISPLAY CO., LTD., Yongin-si (KR)

(72) Inventors: Sunho Kim, Seongnam-si (KR); Hyang-A Park, Seoul (KR); Yoomin Ko, Suwon-si (KR); Juchan Park, Seoul (KR); Sun Hee Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 626 days.

(21) Appl. No.: 17/654,283

(22) Filed: Mar. 10, 2022

(65) Prior Publication Data

US 2022/0367593 A1 Nov. 17, 2022

(30) Foreign Application Priority Data

May 13, 2021 (KR) .......................... 10-2021-0062195

(51) Int. Cl.
*H10K 59/12* (2023.01)
*H10K 59/131* (2023.01)
*H10D 86/40* (2025.01)
*H10D 86/60* (2025.01)
*H10K 59/121* (2023.01)

(52) U.S. Cl.
CPC ......... *H10K 59/131* (2023.02); *H10D 86/441* (2025.01); *H10D 86/60* (2025.01); *H10K 59/1213* (2023.02)

(58) Field of Classification Search
CPC .. H10K 59/131; H10K 59/1213; H10K 59/35; H01L 27/124; G09G 2300/0426; G09G 2300/043; G09G 2310/0281
See application file for complete search history.

(56) References Cited

U.S. PATENT DOCUMENTS

| | | |
|---|---|---|
| 8,508,438 B2 | 8/2013 | Suh |
| 10,217,416 B2 | 2/2019 | Lee et al. |
| 10,957,755 B2* | 3/2021 | Han ........................ G09G 3/20 |
| 2019/0189681 A1* | 6/2019 | Chae ................... H01L 25/0756 |
| 2020/0105205 A1* | 4/2020 | Woo ..................... G09G 3/3258 |
| 2020/0105849 A1* | 4/2020 | Kim ..................... H10K 59/1213 |

(Continued)

FOREIGN PATENT DOCUMENTS

| CN | 109541865 | 3/2019 |
|---|---|---|
| KR | 10-2020-0017012 | 2/2020 |

*Primary Examiner* — Sheikh Maruf
(74) *Attorney, Agent, or Firm* — F. CHAU & ASSOCIATES, LLC

(57) ABSTRACT

A display device includes a main light emitting part, a first sub-light emitting part spaced apart from the main light emitting part in a first direction, a main pixel circuit connected to the main light emitting part, and overlapping at least a portion of the main light emitting part, a first sub-pixel circuit, without overlapping the first sub-light emitting part, connected to the first sub-light emitting part, and spaced apart from the first sub-light emitting part in a second direction that is perpendicular to the first direction, a main data line extending in the first direction, and connected to the main pixel circuit, a first sub-data line extending in the first direction, and connected to the first sub-pixel circuit, and a first bridge line connecting the main data line to the first sub-data line.

20 Claims, 19 Drawing Sheets

(56) References Cited

U.S. PATENT DOCUMENTS

| | | | |
|---|---|---|---|
| 2020/0194532 A1* | 6/2020 | Lee | G09G 3/3266 |
| 2020/0403057 A1* | 12/2020 | Kang | H10K 59/121 |
| 2021/0183983 A1* | 6/2021 | Bang | H10K 59/121 |
| 2021/0358967 A1* | 11/2021 | Kim | G09G 3/20 |
| 2021/0391400 A1* | 12/2021 | Kim | H10K 59/121 |
| 2022/0028938 A1* | 1/2022 | Zhao | H10K 59/131 |
| 2022/0384548 A1* | 12/2022 | Keum | H10K 59/1213 |
| 2022/0392408 A1* | 12/2022 | Zhang | G09G 3/3266 |
| 2022/0392985 A1* | 12/2022 | Song | G09G 3/035 |
| 2022/0406763 A1* | 12/2022 | Yang | H01L 25/167 |
| 2022/0415265 A1* | 12/2022 | Ota | G09G 3/3283 |
| 2023/0033702 A1* | 2/2023 | Feng | H01L 27/124 |

* cited by examiner

DISPLAY DEVICE

CROSS-REFERENCE TO RELATED APPLICATION

This application claims priority under 35 USC § 119 to Korean Patent Application No 10-2021-0062195 filed on May 13, 2021 in the Korean Intellectual Property Office (KIPO), the entire disclosure of which is incorporated herein by reference.

BACKGROUND

1. Field

The present disclosure relates to a display device.

2. Description of the Related Art

A display device may include a display area in which an image is displayed, and a peripheral area in which an image is not displayed. For example, a plurality of pixels may be disposed in the display area, and a gate driver, an emission control driver, and the like may be disposed in the peripheral area.

The display device may include a plurality of sub-pixels and a plurality of main pixels. The main pixel may include: a main pixel circuit disposed in the display area; and a main light emitting part at least partially overlapping the main pixel circuit, and connected to the main pixel circuit. The sub-pixel may include: a sub-pixel circuit disposed in the display area; and a sub-light emitting part that does not overlap the sub-pixel circuit and is connected to the sub-pixel circuit. For example, the sub-light emitting part may be disposed in the peripheral area. Accordingly, an image may be displayed even in the peripheral area of the display device, so that a dead space of the display device may be reduced.

Recently, a display device including a corner having a round shape has been developed. In this case, pixel circuits connected to light emitting parts, which are adjacent to the corner of the display device and located in the same column, may be located in mutually different columns from each other. Accordingly, there is a growing need for a display device capable of applying the same data voltage to pixel circuits located in mutually different rows from each other and mutually different columns from each other.

SUMMARY

An object of the present disclosure to provide a display device capable of applying the same data voltage to pixel circuits located in mutually different rows from each other and mutually different columns from each other.

However, objects of the present disclosure are not limited to the above-described object, and may be variously expanded without departing from the idea and scope of the present disclosure.

In order to achieve the objects of the present disclosure described above, according to one embodiment of the present disclosure, a display device includes: a main light emitting part; a first sub-light emitting part spaced apart from the main light emitting part in a first direction; a main pixel circuit connected to the main light emitting part, and overlapping at least a portion of the main light emitting part; a first sub-pixel circuit, without overlapping the first sub-light emitting part, connected to the first sub-light emitting part, and spaced apart from the first sub-light emitting part in a second direction that is perpendicular to the first direction, the first direction and the second direction extending along a same plane; a main data line extending in the first direction, and connected to the main pixel circuit; a first sub-data line extending in the first direction, and connected to the first sub-pixel circuit; and a first bridge line connecting the main data line to the first sub-data line.

According to one embodiment, the first bridge line may include: a first vertical bridge line connected to the main data line, and extending in the first direction; and a first horizontal bridge line connecting the first vertical bridge line to the first sub-data line, and extending in the second direction.

According to one embodiment, a portion of the first vertical bridge line may overlap the main pixel circuit.

According to one embodiment, a portion of the main data line may overlap the main pixel circuit, and a portion of the first sub-data line may overlap the first sub-pixel circuit.

According to one embodiment, a first distance from the main light emitting part to the main data line may be smaller than a second distance from the first sub-light emitting part to the first sub-data line.

According to one embodiment, a same data voltage may be applied to the main data line and the first sub-data line.

According to one embodiment, the display device may further include: a second sub-light emitting part spaced apart from the first sub-light emitting part in the first direction; a second sub-pixel circuit, without overlapping the second sub-light emitting part, connected to the second sub-light emitting part, and spaced apart from the second sub-light emitting part in the second direction; a second sub-data line extending in the first direction, and connected to the second sub-pixel circuit; and a second bridge line connecting the first sub-data line to the second sub-data line.

According to one embodiment, the second bridge line may extend in the second direction, and may be connected to each of the first sub-data line and the second sub-data line.

According to one embodiment, a same data voltage may be applied to the main data line, the first sub-data line, and the second sub-data line.

According to one embodiment, a second distance from the first sub-light emitting part to the first sub-data line may be smaller than a third distance from the second sub-light emitting part to the second sub-data line.

According to one embodiment, the display device may further include: a third sub-pixel circuit overlapping at least a portion of the first sub-light emitting part; a third sub-light emitting part, without overlapping the third sub-pixel circuit, connected to the third sub-pixel circuit, and spaced apart from the first sub-light emitting part in a third direction that is opposite to the second direction; and a third sub-data line extending in the first direction, and connected to the third sub-pixel circuit.

According to one embodiment, the third sub-data line may be spaced apart from the main data line in the first direction.

According to one embodiment, a first data voltage may be applied to the first sub-data line, and a second data voltage that is different from the first data voltage may be applied to the third sub-data line.

According to one embodiment, a portion of the third sub-data line may overlap the third sub-pixel circuit.

In order to achieve the objects of the present disclosure described above, according to another embodiment of the present disclosure, a display device includes: a first sub-light emitting part; a second sub-light emitting part spaced apart from the first sub-light emitting part in a first direction; a first sub-pixel circuit, without overlapping the first sub-light emitting part, connected to the first sub-light emitting part, and spaced apart from the first sub-light emitting part in a second direction that is perpendicular to the first direction; a second sub-pixel circuit, without overlapping the second sub-light emitting part, connected to the second sub-light emitting part, and spaced apart from the second sub-light emitting part in the second direction; a first sub-data line extending in the first direction, and connected to the first sub-pixel circuit; a second sub-data line extending in the first direction, and connected to the second sub-pixel circuit; and a first bridge line connecting the first sub-data line to the second sub-data line.

According to one embodiment, the first sub-light emitting part may not overlap the first sub-pixel circuit.

According to one embodiment, a portion of the first sub-data line may overlap the first sub-pixel circuit, and a portion of the second sub-data line may overlap the second sub-pixel circuit.

According to one embodiment, a first distance from the first sub-light emitting part to the first sub-data line may be smaller than a second distance from the second sub-light emitting part to the second sub-data line.

According to one embodiment, the display device may further include: a third sub-light emitting part spaced apart from the second sub-light emitting part in the first direction; a third sub-pixel circuit, without overlapping the third sub-light emitting part, connected to the third sub-light emitting part, and spaced apart from the third sub-light emitting part in the second direction; a third sub-data line extending in the first direction, and connected to the third sub-pixel circuit; and a second bridge line connecting the second sub-data line to the third sub-data line.

According to one embodiment, a second distance from the second sub-light emitting part to the second sub-data line may be smaller than a third distance from the third sub-light emitting part to the third sub-data line.

According to the display device of one embodiment of the present disclosure, the main data line and the first sub-data line are connected to each other by the first bridge line, so that the main pixel circuit and the first sub-pixel circuit connected to the main light emitting part and the first sub-light emitting part, respectively, can receive the same data voltage.

According to the display device according to another embodiment of the present disclosure, the first sub-data line and the second sub-data line are connected to each other by the first bridge line, so that the first sub-pixel circuit and the second sub-pixel circuit connected to the first sub-light emitting part and the second sub-light emitting part, respectively, can receive the same data voltage.

However, effects of the present disclosure are not limited to the above-described effects, and may be variously expanded without departing from the idea and scope of the present disclosure.

DETAILED DESCRIPTION OF THE EMBODIMENTS

Figure 1:
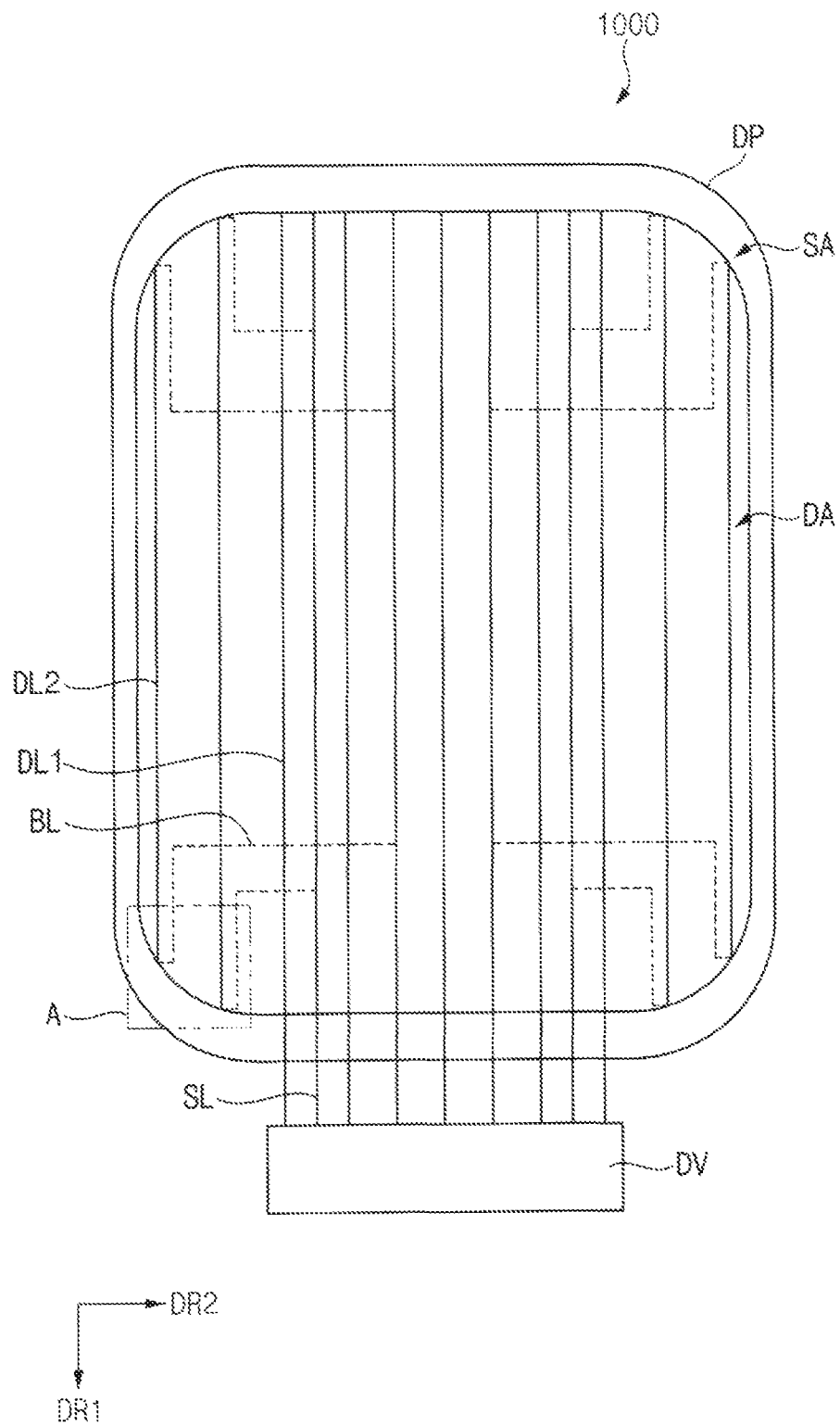
FIG. 1 is a plan view showing a display device according to some embodiments of the present disclosure.

Hereinafter, a display device according to some embodiments of the present disclosure will be described in more detail with reference to the accompanying drawings. The same or similar reference numerals will be used for the same elements in the accompanying drawings.

FIG. 1 is a plan view showing a display device according to some embodiments of the present disclosure.

Referring to FIG. 1, a display device 1000 may include a display unit DP, a data driver DV, a first data line DL1, a second data line DL2, a signal transmission line SL, and a bridge line BL.

The display unit DP may include a display area DA, and a peripheral area SA surrounding the display area DA. The display area DA may be an area in which an image is displayed. A gate driver (not shown) configured to output a gate signal, an emission control driver (not shown) configured to output an emission control signal, and the like may be disposed in the peripheral area SA.

A corner of the display area DA and a corner of the peripheral area SA may have a round shape. For example, in a region A, a boundary between the display area DA and the peripheral area SA may have a predetermined radius of curvature.

The display unit DP may include a plurality of pixels. Each of the pixels may include a light emitting part (e.g., a light emitting diode), and a pixel circuit connected to the light emitting part. The pixel circuit may receive the gate signal, the emission control signal, and a data voltage output from the data driver DV. The pixel circuit may allow the light emitting part to emit light according to a level of the data voltage. The display device 1000 may display an image by using the light emitted from the light emitting part.

The pixels may include a main pixel and a sub-pixel. The main pixel may include a main pixel circuit (e.g., C1 of FIG. 2) disposed in the display area DA, and a main light emitting part (e.g., L1 of FIG. 2) connected to the main pixel circuit. At least a portion of the main light emitting part may overlap the main pixel circuit. In some embodiments, a main pixel may include a pixel circuit, and a light emitting part. The pixel circuit and the light emitting part are electrically connected with each other and overlap each other.

The sub-pixel may include a sub-pixel circuit (e.g., SC1 of FIG. 2) disposed in the display area DA, and a sub-light emitting part (e.g., SL1 of FIG. 2) connected to the sub-pixel circuit. The sub-pixel circuit may not overlap the sub-light emitting part. For example, the sub-light emitting part may be disposed in the peripheral area SA (e.g., SL1 of FIG. 2). Accordingly, an image may be displayed even in the peripheral area SA. Another sub-light emitting part (e.g., SL3 of FIG. 2) may be disposed in the display area DA, and another sub-pixel circuit (e.g., SC3 of FIG. 2) may be connected to the another sub-light emitting part without overlapping the another sub-light emitting part. In some embodiments, a sub-pixel may include a sub-pixel circuit, and a sub-light emitting part, and the sub-pixel circuit and the sub-light emitting part are electrically connected with each other without overlapping each other.

The data driver DV may generate the data voltage. The data voltage generated by the data driver DV may be supplied to the pixel circuit through the first data line DL1, the signal transmission line SL, the bridge line BL, and the second data line DL2.

The first data line DL1 may extend in a first direction DR1. The first data line DL1 may be provided in plural, and two or more data lines may be arranged in a second direction DR2 that is perpendicular to the first direction DR1. The first data line DL1 may be directly connected to the data driver DV. In the display area DA, the first data line DL1 may be directly connected to the pixel circuit that overlaps at least a portion of the first data line DL1.

The signal transmission line SL may extend in the first direction DR1. The signal transmission line SL may be provided in plural, and two or more signal transmission lines may be arranged in the second direction DR2. The signal transmission line SL may be directly connected to the data driver DV. In the display area DA, the signal transmission line SL may not be directly connected to the pixel circuit.

The second data line DL2 may extend in the first direction DR1. The second data line DL2 may be provided in plural, and two or more second data lines may be arranged in the second direction DR2. The second data line DL2 may be adjacent to an edge of the display area DA in the second direction DR2. In the display area DA, the second data line DL2 may be directly connected to a pixel circuit that overlaps at least a portion of the second data line DL2.

The bridge line BL may be connected to the signal transmission line SL and the second data line DL2. Accordingly, the data voltage output from the data driver DV may be supplied to the second data line DL2 through the signal transmission line SL and the bridge line BL.

In some embodiments, the bridge line BL may be disposed in the display area DA, and the first data line DL1, the signal transmission line SL, the bridge line BL, and the second data line DL2 may be symmetrical to each other based on the first direction DR1 in the display area DA. At the same time, the first data line DL1, the signal transmission line SL, the bridge line BL, and the second data line DL2 may be symmetrical to each other based on the second direction DR2 in the display area DA.

Figure 2:
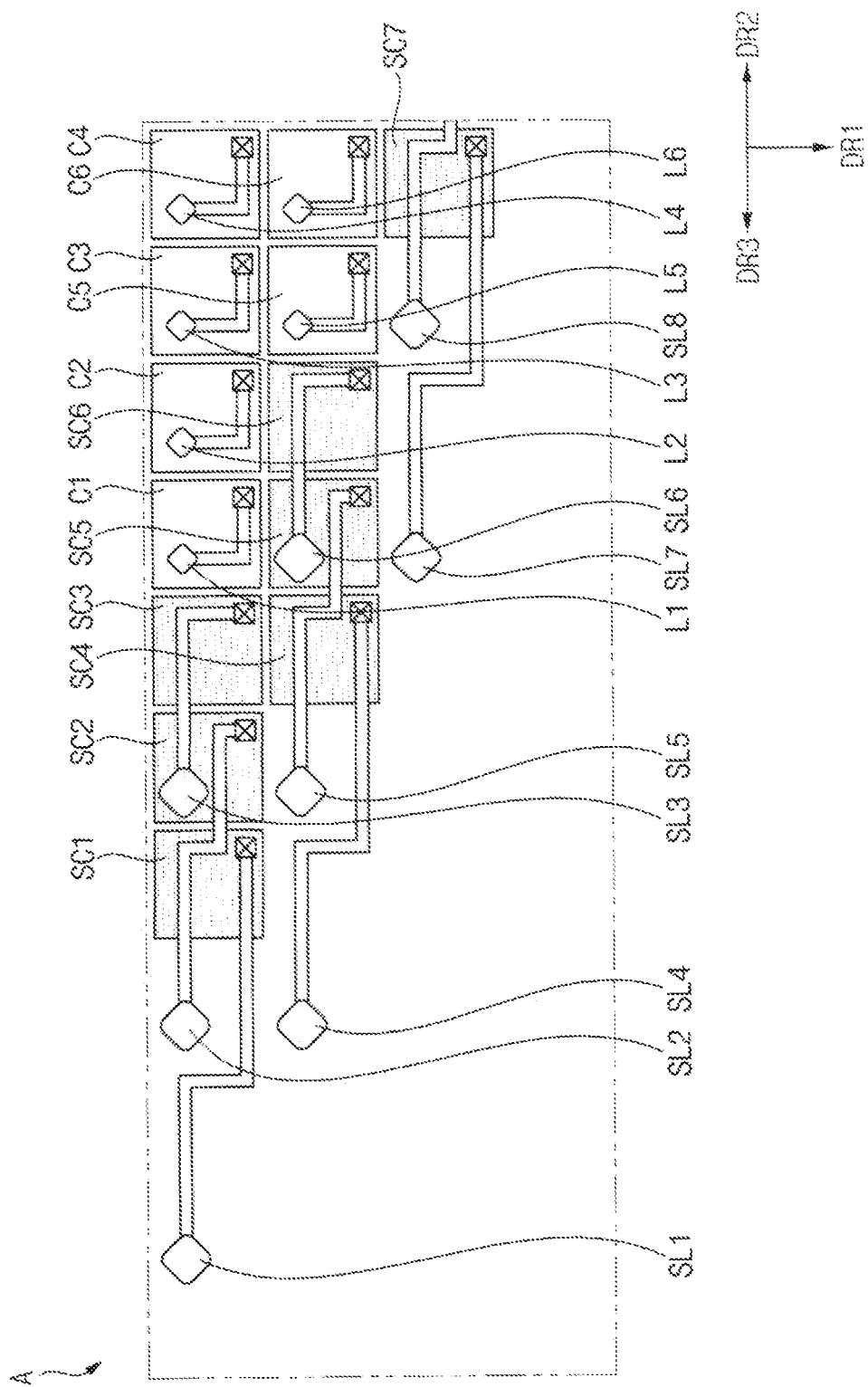
FIGS. 2 to 4 are plan views showing a display device according to some embodiments of the present disclosure.
Figure 3:
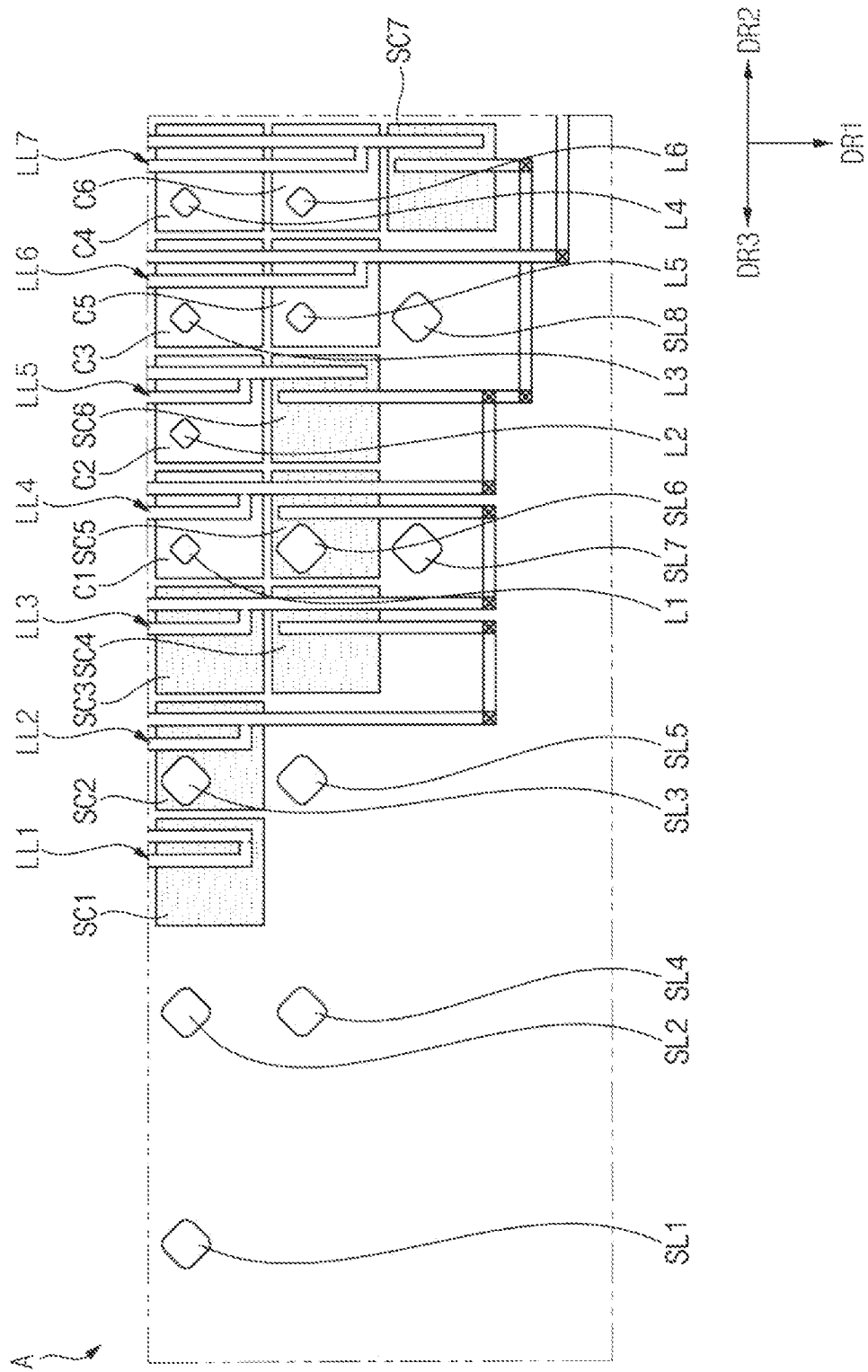
Figure 4:
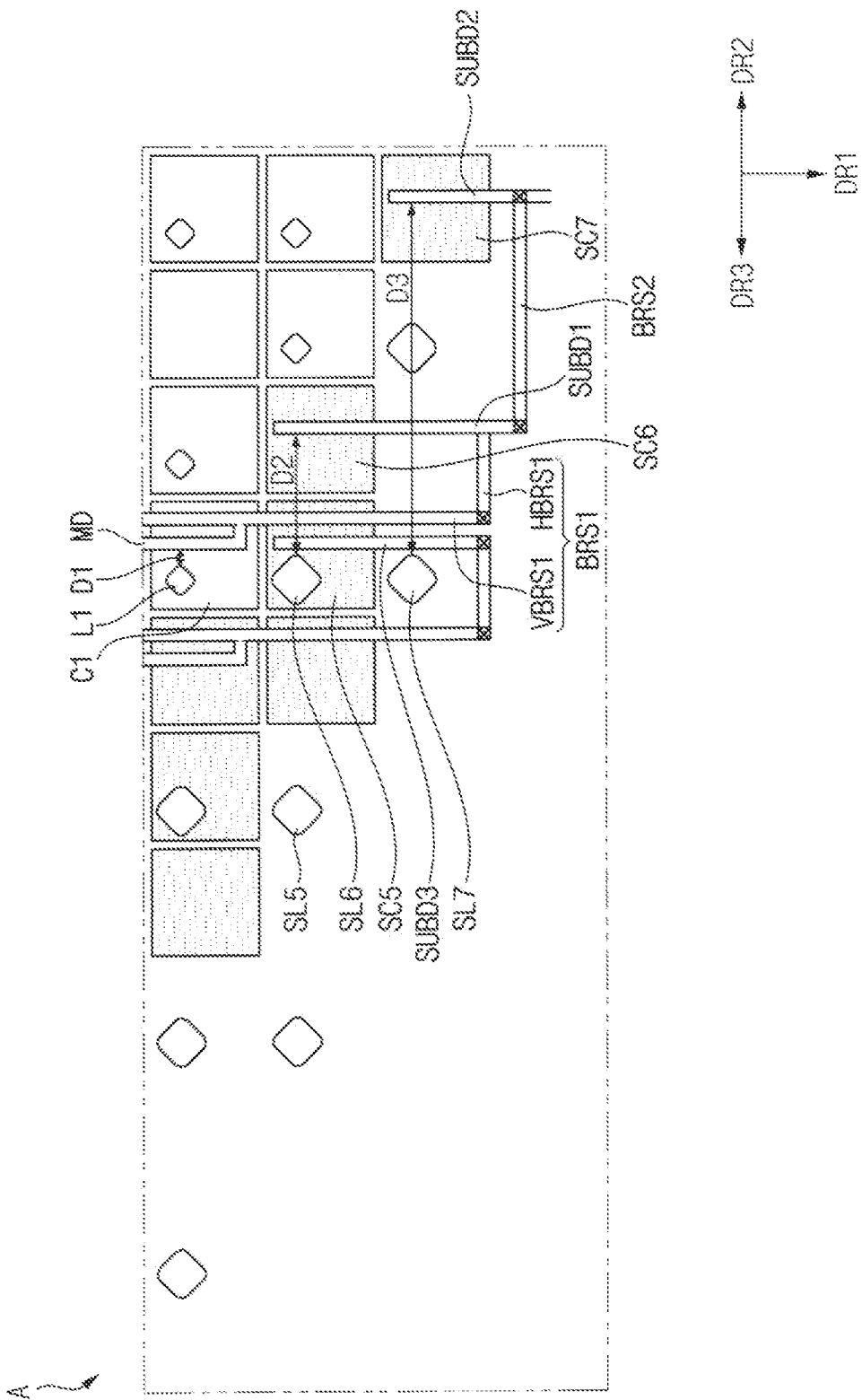

FIGS. 2 to 4 are plan views showing a display device according to some embodiments of the present disclosure. For example, FIGS. 2 to 4 may be enlarged plan views showing a region A of FIG. 1, in which FIG. 2 may be a plan view showing a connection relation between a light emitting part and a pixel circuit, FIG. 3 may be a plan view showing a connection relation between a data line and the pixel circuit, and FIG. 4 may be a plan view for describing a portion of the data line shown in FIG. 3.

Referring to FIG. 2, a display device (1000 of FIG. 1) according to some embodiments of the present disclosure may include first to seventh sub-pixel circuits SC1, SC2, SC3, SC4, SC5, SC6, and SC7, first to sixth main pixel circuits C1, C2, C3, C4, C5, and C6, first to seventh sub-light emitting parts SL1, SL2, SL3, SL4, SL5, SL6, and SL7, and first to sixth main light emitting parts L1, L2, L3, L4, L5, and L6.

The first to third sub-pixel circuits SC1, SC2, and SC3 and the first to fourth main pixel circuits C1, C2, C3, and C4 may be sequentially arranged in the second direction DR2, the fourth to sixth sub-pixel circuits SC4, SC5, and SC6 and the fifth and sixth main pixel circuits C5 and C6 may be sequentially arranged in the second direction DR2, the third sub-pixel circuit SC3 and the fourth sub-pixel circuit SC4 may be sequentially arranged in the first direction DR1, and the sixth main pixel circuit C6 and the seventh sub-pixel circuit SC7 may be sequentially arranged in the first direction DR1.

The first to seventh sub-pixel circuits SC1, SC2, SC3, SC4, SC5, SC6, and SC7 may be connected to the first to seventh sub-light emitting parts SL1, SL2, SL3, SL4, SL5, SL6, and SL7, respectively. The first to seventh sub-light emitting parts SL1, SL2, SL3, SL4, SL5, SL6, and SL7 may be spaced apart from the first to seventh sub-pixel circuits SC1, SC2, SC3, SC4, SC5, SC6, and SC7 in a third direction DR3 that is opposite to the second direction DR2.

For example, the first sub-pixel circuit SC1 may be connected to the first sub-light emitting part SL1, and the first sub-light emitting part SL1 may be spaced apart from the first sub-pixel circuit SC1 in the third direction DR3. In some embodiments, the first sub-light emitting part SL1 may not overlap the first sub-pixel circuit SC1.

The first to seventh sub-pixel circuits SC1, SC2, SC3, SC4, SC5, SC6, and SC7 and the first to seventh sub-light emitting parts SL1, SL2, SL3, SL4, SL5, SL6, and SL7 may define sub-pixels, respectively.

For example, the first sub-pixel circuit SC1 and the first sub-light emitting part SL1 connected to the first sub-pixel circuit SC1 may define a first sub-pixel.

The sub-pixel may be configured such that a sub-light emitting part does not overlap a sub-pixel circuit connected to the sub-light emitting part. For example, the first sub-light emitting part SL1 may not overlap the first sub-pixel circuit SC1. In this case, the first sub-light emitting part SL1 may be disposed in the peripheral area (SA of FIG. 1), and the first sub-pixel circuit SC1 may be disposed in the display area (DA of FIG. 1).

The first to sixth main pixel circuits C1, C2, C3, C4, C5, and C6 may be connected to the first to sixth main light emitting parts L1, L2, L3, L4, L5, and L6, respectively. At least portions of the first to sixth main light emitting parts L1, L2, L3, L4, L5, and L6 may overlap the first to sixth main pixel circuits C1, C2, C3, C4, C5, and C6, respectively.

For example, the first main pixel circuit C1 may be connected to the first main light emitting part L1, and at least a portion of the first main light emitting part L1 may overlap the first main pixel circuit C1.

The first to sixth main pixel circuits C1, C2, C3, C4, C5, and C6 and the first to sixth main light emitting parts L1, L2, L3, L4, L5, and L6 may define main pixels, respectively.

For example, the first main pixel circuit C1 and the first main light emitting part L1 may define a first main pixel.

Referring to FIG. 3, the display device (1000 of FIG. 1) according to some embodiments of the present disclosure may include first to seventh wires LL1, LL2, LL3, LL4, LL5, LL6, and LL7. Each of the first to seventh wires LL1, LL2, LL3, LL4, LL5, LL6, and LL7 may include a second data line (DL2 of FIG. 1) and a bridge line (BL of FIG. 1). Accordingly, the data voltage output from the data driver (DV of FIG. 1) may be provided to the pixel circuits SC1, SC2, SC3, SC4, SC5, SC6, SC7, C1, C2, C3, C4, C5, and C6 through the first to seventh wires LL1, LL2, LL3, LL4, LL5, LL6, and LL7. Mutually different data voltages may be provided to the first to seventh wires LL1, LL2, LL3, LL4, LL5, LL6, and LL7, respectively.

The first wire LL1 may be connected to the first sub-pixel circuit SC1. The second wire LL2 may be connected to the second sub-pixel circuit SC2 and the fourth sub-pixel circuit SC4. The third wire LL3 may be connected to the third sub-pixel circuit SC3 and the fifth sub-pixel circuit SC5. The fourth wire LL4 may be connected to the first main pixel circuit C1, the sixth sub-pixel circuit SC6, and the seventh sub-pixel circuit SC7. The fifth wire LL5 may be connected to the second main pixel circuit C2. The sixth wire LL6 may be connected to the third main pixel circuit C3 and the fifth main pixel circuit C5. The seventh wire LL7 may be connected to the fourth main pixel circuit C4 and the sixth main pixel circuit C6.

Referring to FIGS. 2 to 4, the sixth sub-light emitting part SL6 may be spaced apart from the first main light emitting part L1 in the first direction DR1. The first main pixel circuit C1 may overlap at least a portion of the first main light emitting part L1, and the sixth sub-pixel circuit SC6 may be spaced apart from the sixth sub-light emitting part SL6 in the second direction DR2, without overlapping the sixth sub-light emitting part SL6.

The fourth wire LL4 may include: a main data line MD extending in the first direction DR1, and connected to the first main pixel circuit C1; a first sub-data line SUBD1 extending in the first direction DR1, and connected to the sixth sub-pixel circuit SC6; and a first bridge line BRS1 connecting the main data line MD to the first sub-data line SUBD1.

A portion of the main data line MD may overlap the first main pixel circuit C1. A portion of the first sub-data line SUBD1 may overlap the sixth sub-pixel circuit SC6. In this case, a first distance D1 from the main light emitting part L1 to the main data line MD may be smaller than a second distance D2 from the sixth sub-light emitting part SL6 to the first sub-data line SUBD1. In some embodiments, the first distance D1 may be the shortest distance between the main light emitting part L1 and the main data line MD. In some embodiments, the second distance D2 may be the shortest distance between the sixth sub-light emitting part SL6 and the first sub-data line SUBD1.

The data voltage generated by the data driver (DV of FIG. 1) may be transmitted to the main data line MD and the first sub-data line SUBD1 through the first bridge line BRS1. For example, the first bridge line BRS1 may be substantially the same as the bridge line BL described with reference to FIG. 1. Accordingly, the same data voltage may be applied to the main data line MD and the first sub-data line SUBD1, so that the same data voltage may be applied to the first main pixel circuit C1 and the sixth sub-pixel circuit SC6.

According to some embodiments, the first bridge line BRS1 may include: a first vertical bridge line VBRS1 connected to the main data line MD, and extending in the first direction DR1; and a first horizontal bridge line HBRS1 connecting the first vertical bridge line VBRS1 to the first sub-data line SUBD1, and extending in the second direction DR2.

A portion of the first vertical bridge line VBRS1 may overlap the first main pixel circuit C1. The first horizontal bridge line HBRS1 may not overlap the pixel circuits SC1, SC2, SC3, SC4, SC5, SC6, SC7, C1, C2, C3, C4, C5, and C6. For example, the first horizontal bridge line HBRS1 may be disposed in the peripheral area (SA of FIG. 1).

According to one embodiment, the seventh sub-light emitting part SL7 may be spaced apart from the sixth sub-light emitting part SL6 in the first direction DR1, and the seventh sub-light emitting circuit SC7 may be spaced apart from the seventh sub-light emitting part SL7 in the second direction DR2.

In this case, the fourth wire LL4 may further include: a second sub-data line SUBD2 extending in the first direction DR1, and connected to the seventh sub-pixel circuit SC7; and a second bridge line BRS2 connecting the first sub-data line SUBD1 to the second sub-data line SUBD2. For example, the second bridge line BRS2 may extend in the second direction DR2, and may be connected to each of the first sub-data line SUBD1 and the second sub-data line SUBD2. For example, the second bridge line BRS2 may be disposed in the peripheral area.

A portion of the second sub-data line SUBD2 may overlap the seventh sub-pixel circuit SC7. In this case, the second distance D2 from the sixth sub-light emitting part SL6 to the first sub-data line SUBD1 may be smaller than a third distance D3 from the seventh sub-light emitting part SL7 to the second sub-data line SUBD2. In some embodiments, the third distance D3 may be the shortest distance between the seventh sub-light emitting part SL7 and the second sub-data line SUBD2.

The main data line MD, the first sub-data line SUBD1, and the second sub-data line SUBD2 may be connected to each other by the first bridge line BRS1 and the second bridge line BRS2. Accordingly, the same data voltage may be applied to the main data line MD, the first sub-data line SUBD1, and the second sub-data line SUBD2, so that the same data voltage may be applied to the first main pixel circuit C1, the sixth sub-pixel circuit SC6, and the seventh sub-pixel circuit SC7.

According to some embodiment, the fifth sub-pixel circuit SC5 may overlap at least a portion of the sixth sub-light emitting part SL6, and the fifth sub-light emitting part SL5 may be spaced apart from the sixth sub-light emitting part SL6 in the third direction DR3. In some embodiment, the fifth sub-pixel circuit SC5 and the fifth sub-light emitting part SL5 may not overlap each other. The fifth sub-light emitting part SL5 may be located in the peripheral area.

In this case, the third wire LL3 may include a third sub-data line SUBD3 extending in the first direction DR1 and connected to the fifth sub-pixel circuit SC5.

A portion of the third sub-data line SUBD3 may overlap the fifth sub-pixel circuit SC5. The third sub-data line SUBD3 may be spaced apart from the main data line MD in the first direction DR1.

Mutually different data voltages may be applied to the third wire LL3 and the fourth wire LL4, respectively. For example, a first data voltage may be applied to the first sub-data line SUBD1 included in the fourth wire LL4, and a second data voltage that is different from the first data voltage may be applied to the third sub-data line SUBD3 included in the third wire LL3.

Figure 5:
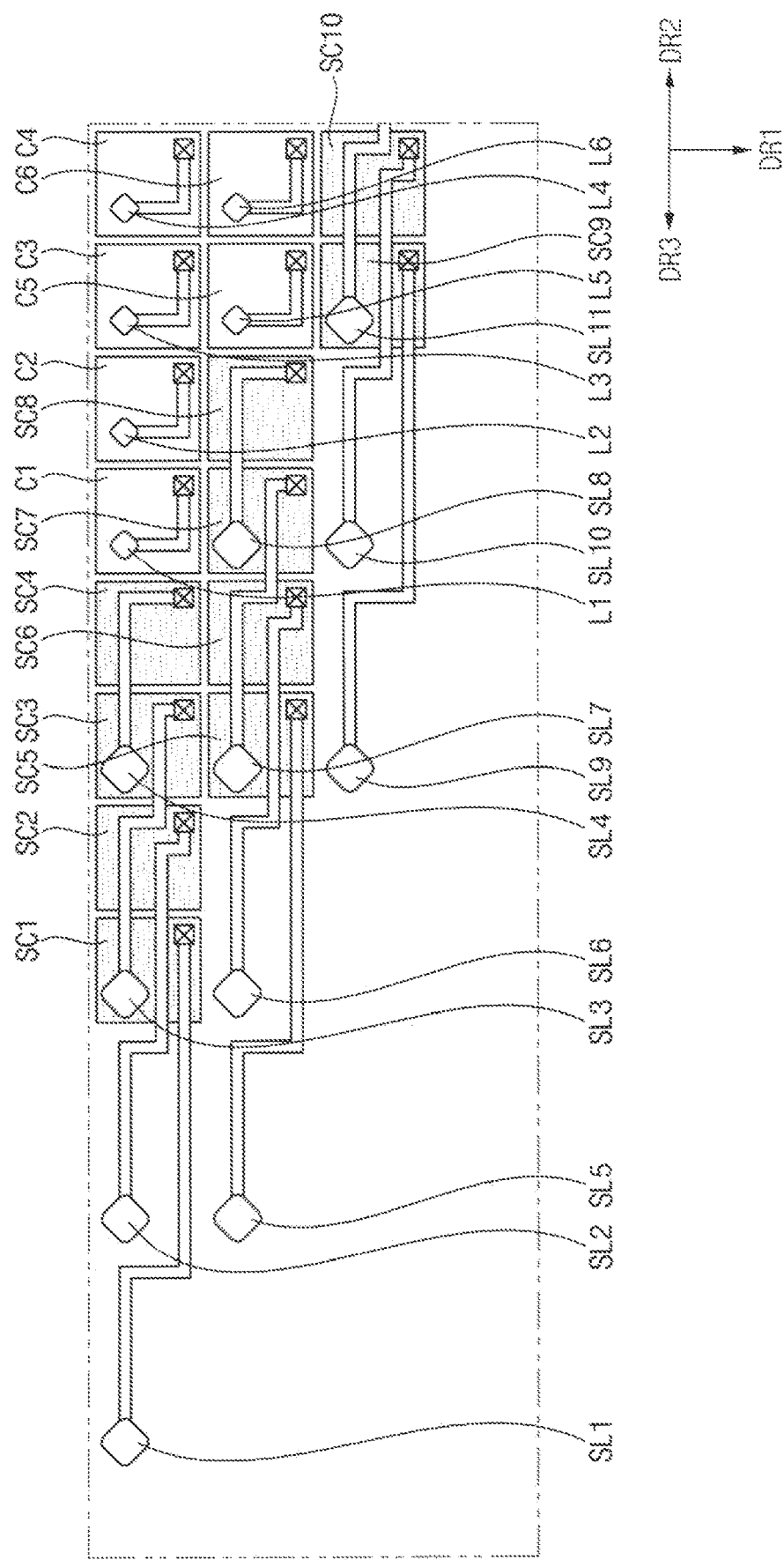
FIGS. 5 to 7 are plan views showing a display device according to some embodiments of the present disclosure.
Figure 6:
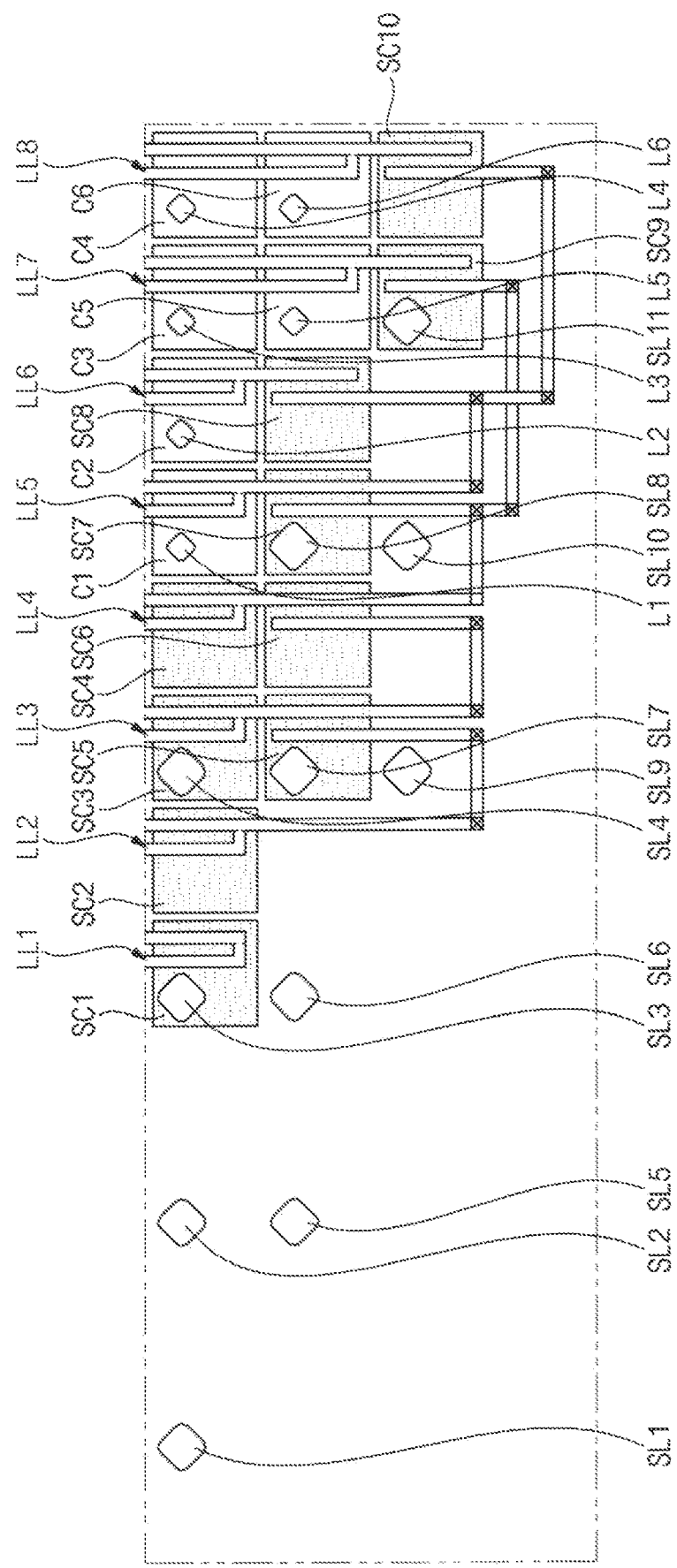
Figure 7:
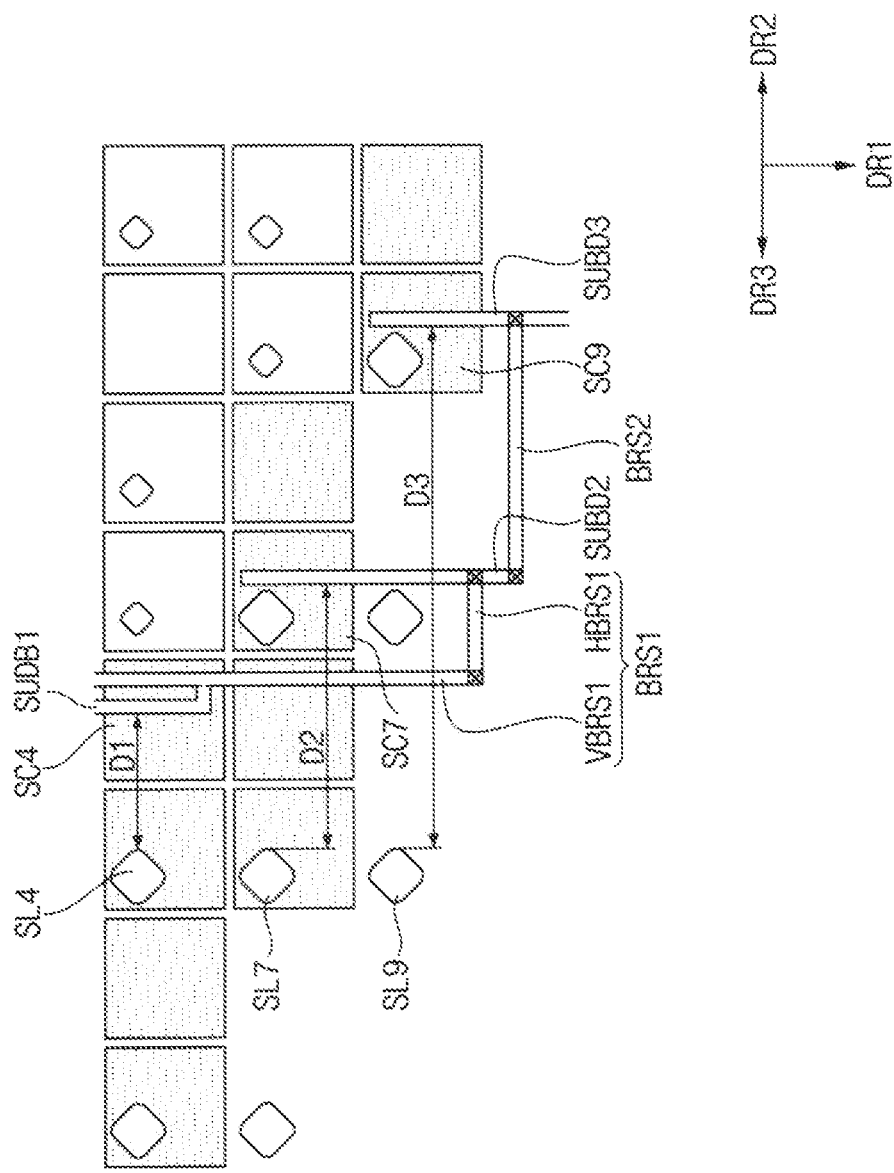

FIGS. 5 to 7 are plan views showing a display device according to some embodiments of the present disclosure. For example, FIGS. 5 to 7 may be enlarged plan views showing the region A of FIG. 1, in which FIG. 5 may be a plan view showing a connection relation between a light emitting part and a pixel circuit, FIG. 6 may be a plan view showing a connection relation between a data line and the pixel circuit, and FIG. 7 may be a plan view for describing a portion of the data line shown in FIG. 6.

Referring to FIG. 5, a display device (1000 of FIG. 1) according to some embodiments of the present disclosure may include first to tenth sub-pixel circuits SC1, SC2, SC3, SC4, SC5, SC6, SC7, SC8, SC9, and SC10, first to sixth main pixel circuits C1, C2, C3, C4, C5, and C6, first to tenth sub-light emitting parts SL1, SL2, SL3, SL4, SL5, SL6, SL7, SL8, SL9, and SL10, and first to sixth main light emitting parts L1, L2, L3, L4, L5, and L6.

The first to fourth sub-pixel circuits SC1, SC2, SC3, and SC4 and the first to fourth main pixel circuits C1, C2, C3, and C4 may be sequentially arranged in the second direction DR2, the fifth to eighth sub-pixel circuits SC5, SC6, SC7, and SC8 and the fifth and sixth main pixel circuits C5 and C6 may be sequentially arranged in the second direction DR2, the ninth sub-pixel circuit SC9 and the tenth sub-pixel circuit SC10 may be sequentially arranged in the second direction DR2, the third sub-pixel circuit SC3 and the fifth sub-pixel circuit SC5 may be sequentially arranged in the first direction DR1 that is perpendicular to the second direction DR2, and the fifth main pixel circuit C5 and the ninth sub-pixel circuit SC9 may be sequentially arranged in the first direction DR1.

The first to tenth sub-pixel circuits SC1, SC2, SC3, SC4, SC5, SC6, SC7, SC8, SC9, and SC10 may be connected to the first to tenth sub-light emitting parts SL1, SL2, SL3, SL4, SL5, SL6, SL7, SL8, SL9, and SL10, respectively. The first to tenth sub-pixel circuits SC1, SC2, SC3, SC4, SC5, SC6, SC7, SC8, SC9, and SC10 may be spaced apart from the first to tenth sub-light emitting parts SL1, SL2, SL3, SL4, SL5, SL6, SL7, SL8, SL9, and SL10 in the third direction DR3 that is opposite to the second direction DR2, respectively. In some embodiments, the first to tenth sub-pixel circuits SC1, SC2, SC3, SC4, SC5, SC6, SC7, SC8, SC9, and SC10 may not overlap the first to tenth sub-light emitting parts SL1, SL2, SL3, SL4, SL5, SL6, SL7, SL8, SL9, and SL10, respectively.

The first to tenth sub-pixel circuits SC1, SC2, SC3, SC4, SC5, SC6, SC7, SC8, SC9, and SC10 and the first to tenth sub-light emitting parts SL1, SL2, SL3, SL4, SL5, SL6, SL7, SL8, SL9, and SL10 may define sub-pixels, respectively. The sub-pixel may be configured such that a sub-light emitting part does not overlap a sub-pixel circuit connected to the sub-light emitting part.

The first to sixth main pixel circuits C1, C2, C3, C4, C5, and C6 may be connected to the first to sixth main light emitting parts L1, L2, L3, L4, L5, and L6, respectively. At least portions of the first to sixth main light emitting parts L1, L2, L3, L4, L5, and L6 may overlay the first to sixth main pixel circuits C1, C2, C3, C4, C5, and C6, respectively. The first to sixth main pixel circuits C1, C2, C3, C4, C5, and C6 and the first to sixth main light emitting parts L1, L2, L3, L4, L5, and L6 may define main pixels, respectively.

Referring to FIG. 6, the display device (1000 of FIG. 1) according to some embodiments of the present disclosure may include first to eighth wires LL1, LL2, LL3, LL4, LL5, LL6, LL7, and LL8. Each of the first to eighth wires LL1, LL2, LL3, LL4, LL5, LL6, LL7, and LL8 may include a second data line (DL2 of FIG. 1) and a bridge line (BL of FIG. 1). Accordingly, the data voltage output from the data driver (DV of FIG. 1) may be provided to the pixel circuits SC1, SC2, SC3, SC4, SC5, SC6, SC7, SC8, SC9, SC10, C1, C2, C3, C4, C5, and C6 through the first to eighth wires LL1, LL2, LL3, LL4, LL5, LL6, LL7, and LL8. Mutually different data voltages may be provided to the first to eighth wires LL1, LL2, LL3, LL4, LL5, LL6, LL7, and LL8, respectively.

The first wire LL1 may be connected to the first sub-pixel circuit SC1. The second wire LL2 may be connected to the second sub-pixel circuit SC2 and the fifth sub-pixel circuit SC5. The third wire LL3 may be connected to the third sub-pixel circuit SC3 and the sixth sub-pixel circuit SC6. The fourth wire LL4 may be connected to the fourth sub-pixel circuit SC4, the seventh sub-pixel circuit SC7, and the ninth sub-pixel circuit SC9. The fifth wire LL5 may be connected to the first main pixel circuit C1 and the eighth sub-pixel circuit SC8. The sixth wire LL6 may be connected to the second main pixel circuit C2. The seventh wire LL7 may be connected to the third main pixel circuit C3 and the fifth main pixel circuit C5. The eighth wire LL8 may be connected to the fourth main pixel circuit C4 and the sixth main pixel circuit C6.

Referring to FIGS. 5 to 7, the seventh sub-light emitting part SL7 may be spaced apart from the fourth sub-light emitting part SL4 in the first direction DR1. The fourth sub-pixel circuit SC4 may be spaced apart from the fourth sub-light emitting part SL4 in the second direction DR2. The fourth sub-light emitting part SL4 may not overlap the fourth sub-pixel circuit SC4. The seventh sub-pixel circuit SC7 may be spaced apart from the seventh sub-light emitting part SL7 in the second direction DR2. The seventh sub-light emitting part SL7 may not overlap the seventh sub-pixel circuit SC7. The seventh sub-light emitting part SL7 may be disposed in the display area (DA of FIG. 1). For example, at least a portion of the seventh sub-light emitting part SL7 may overlap the fifth sub-pixel circuit SC5.

The fourth wire LL4 may include: a first sub-data line SUBD1 extending in the first direction DR1, and connected to the fourth sub-pixel circuit SC4; a second sub-data line SUBD2 extending in the first direction DR1, and connected to the seventh sub-pixel circuit SC7; and a first bridge line BRS1 connecting the first sub-data line SUBD1 to the second sub-data line SUBD2.

A portion of the first sub-data line SUBD1 may overlap the fourth sub-pixel circuit SC4. A portion of the second sub-data line SUBD2 may overlap the seventh sub-pixel circuit SC7. In this case, a first distance D1 from the fourth sub-light emitting part SL4 to the first sub-data line SUBD1 may be smaller than a second distance D2 from the seventh sub-light emitting part SL7 to the second sub-data line SUBD2. In some embodiments, the first distance D1 may be the shortest distance between the fourth sub-light emitting part SL4 and the first sub-data line SUBD1. In some embodiments, the second distance D2 may be the shortest distance between the seventh sub-light emitting part SL7 and the second sub-data line SUBD2.

The data voltage generated by the data driver (DV of FIG. 1) may be transmitted to the first sub-data line SUBD1 and the second sub-data line SUBD2 through the first bridge line BRS1. For example, the first bridge line BRS1 may be substantially the same as the bridge line BL described with reference to FIG. 1. Accordingly, the same data voltage may be applied to the first sub-data line SUBD1 and the second sub-data line SUBD2, so that the same data voltage may be applied to the fourth sub-pixel circuit SC4 and the seventh sub-pixel circuit SC7.

According to some embodiments, the first bridge line BRS1 may include: a first vertical bridge line VBRS1 connected to the first sub-data line SUBD1, and extending in the first direction DR1; and a first horizontal bridge line HBRS1 connecting the first vertical bridge line VBRS1 to the second sub-data line SUBD2, and extending in the second direction DR2.

A portion of the first vertical bridge line VBRS1 may overlap the fourth sub-pixel circuit SC4. The first horizontal bridge line HBRS1 may not overlap the pixel circuits SC1, SC2, SC3, SC4, SC5, SC6, SC7, SC8, SC9, SC10, C1, C2, C3, C4, C5, and C6. For example, the first horizontal bridge line HBRS1 may be disposed in the peripheral area (SA of FIG. 1).

According to some embodiments, the ninth sub-light emitting part SL9 may be spaced apart from the seventh sub-light emitting part SL7 in the first direction DR1, and the ninth sub-light emitting circuit SC9 may be spaced apart from the ninth sub-light emitting part SL9 in the second direction DR2.

In this case, the fourth wire LL4 may further include: a third sub-data line SUBD3 extending in the first direction DR1, and connected to the ninth sub-light emitting circuit SC9; and a second bridge line BRS2 connecting the second sub-data line SUBD2 to the third sub-data line SUBD3. For example, the second bridge line BRS2 may extend in the second direction DR2, and may be connected to each of the second sub-data line SUBD2 and the third sub-data line SUBD3. For example, the second bridge line BRS2 may be disposed in the peripheral area.

A portion of the third sub-data line SUBD3 may overlap the ninth sub-pixel circuit SC9. In this case, the second distance D2 from the seventh sub-light emitting part SL7 to the second sub-data line SUBD2 may be smaller than a third distance D3 from the ninth sub-light emitting part SL9 to the third sub-data line SUBD3. In some embodiments, the third distance D3 may be the shortest distance between the ninth sub-light emitting part SL9 and the third sub-data line SUBD3.

The first to third sub-data lines SUBD1, SUBD2, and SUBD3 may be connected to each other by the first bridge line BRS1 and the second bridge line BRS2. Accordingly, the same data voltage may be applied to the first to third sub-data lines SUBD1, SUBD2, and SUBD3, so that the same data voltage may be applied to the fourth sub-pixel circuit SC4, the seventh sub-pixel circuit SC7, and the ninth sub-pixel circuit SC9.

Figure 8:
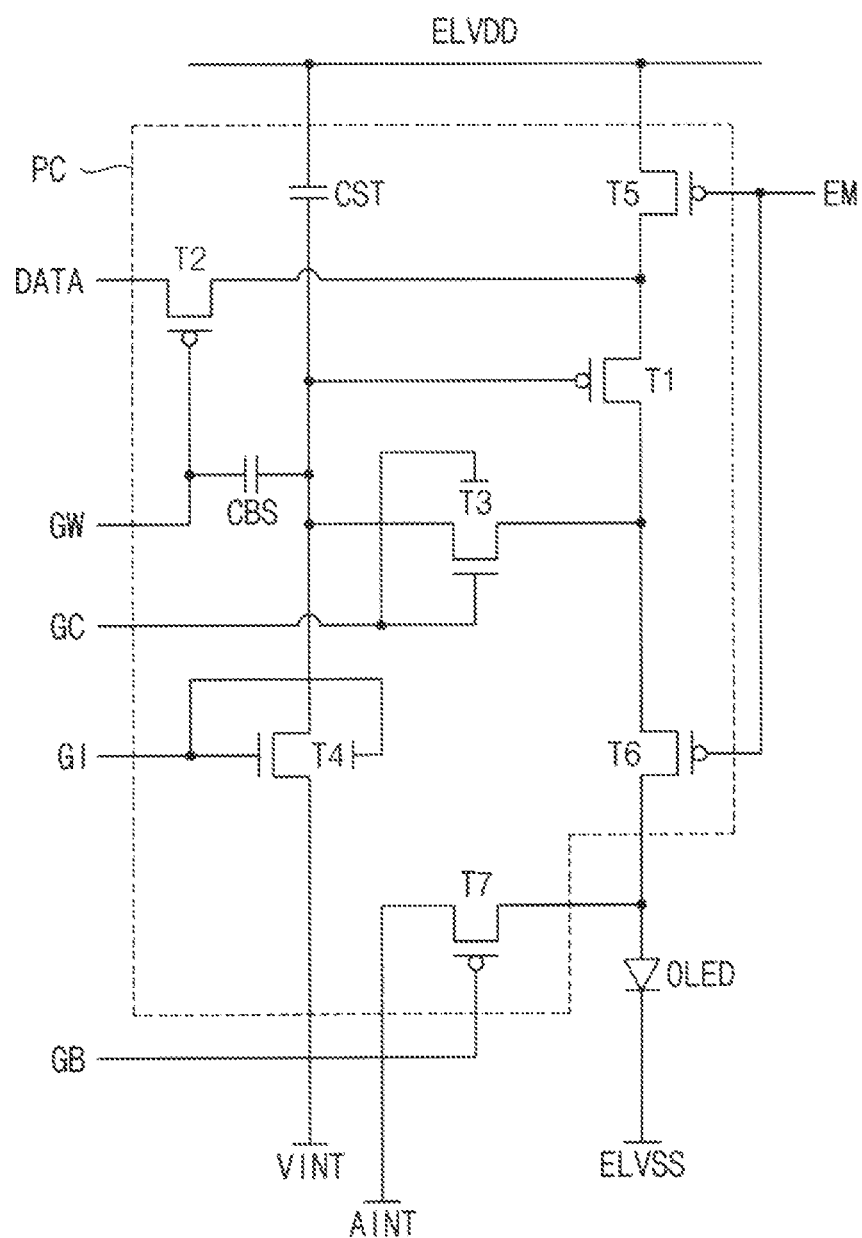
FIG. 8 is a circuit diagram showing a pixel included in the display device according to some embodiments of the present disclosure.

FIG. 8 is a circuit diagram showing a pixel included in the display device according to some embodiments of the present disclosure.

Referring to FIG. 8, the pixel may include a pixel circuit PC, and a light emitting part OLED connected to the pixel circuit PC.

The pixel circuit PC may include a first transistor T1, a second transistor T2, a third transistor T3, a fourth transistor T4, a fifth transistor T5, a sixth transistor T6, a seventh transistor T7, a storage capacitor CST, and a boosting capacitor CBS. The pixel circuit PC may provide a driving current to the light emitting part OLED.

The light emitting part OLED may include a first terminal (e.g., an anode terminal) and a second terminal (e.g., a cathode terminal), in which the first terminal of the light emitting part OLED may be connected to the first transistor T1 through the sixth transistor T6 to receive the driving current, and the second terminal of the light emitting part OLED may receive a low power supply voltage ELVSS. The light emitting part OLED may emit light having a luminance corresponding to the driving current.

The storage capacitor CST may include a first terminal and a second terminal. The first terminal of the storage capacitor CST may be connected to the first transistor T1, and the second terminal of the storage capacitor CST may receive a high power supply voltage ELVDD.

The boosting capacitor CBS may include a first terminal and a second terminal. The first terminal of the boosting capacitor CBS may be connected to the first terminal of the storage capacitor CST, and the second terminal of the boosting capacitor CBS may receive a first gate signal GW. The boosting capacitor CBS may increase a voltage of a gate terminal of the first transistor T1 at a time when provision of the first gate signal GW is stopped, so that a voltage drop at the gate terminal of the first transistor T1 may be compensated for.

The first transistor T1 may include a gate terminal, a first terminal (i.e., a source terminal), and a second terminal (i.e., a drain terminal). The gate terminal of the first transistor T1 may be connected to the first terminal of the storage capacitor CST. The first terminal of the first transistor T1 may be connected to the second transistor T2 to receive a data voltage DATA. The second terminal of the first transistor T1 may provide the driving current to the light emitting part OLED. The first transistor T1 may generate the driving current based on a voltage difference between the gate terminal and the first terminal of the first transistor T1. For example, the first transistor T1 may be referred to as a driving transistor.

The second transistor T2 may include a gate terminal, a first terminal (i.e., a source terminal), and a second terminal (i.e., a drain terminal). The gate terminal of the second transistor T2 may receive the first gate signal GW. The first terminal of the second transistor T2 may receive the data voltage DATA. The second terminal of the second transistor T2 may provide the data voltage DATA to the first terminal of the first transistor T1 during a period in which the second transistor T2 is turned on.

The second transistor T2 may be turned on or off in response to the first gate signal GW. For example, when the second transistor T2 is a p-type metal oxide semiconductor (PMOS) transistor, the second transistor T2 may be turned off when the first gate signal GW has a positive voltage level, and turned on when the first gate signal GW has a negative voltage level. For example, the second transistor T2 may be referred to as a switching transistor.

The third transistor T3 may include a gate terminal, a back-gate terminal, a first terminal (i.e., a source terminal), and a second terminal (i.e., a drain terminal). The gate terminal and the back-gate terminal of the third transistor T3 may receive a second gate signal GC. Since the third transistor T3 has a dual-gate structure, reliability of the third transistor T3 may be improved. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is an n-type metal oxide semiconductor (NMOS) transistor, the third transistor T3 may be turned on when the second gate signal GC has a positive voltage level (e.g., a threshold voltage), and turned off when the second gate signal GC has a voltage level including a negative voltage level smaller than the threshold voltage.

During a period in which the third transistor T3 is turned on in response to the second gate signal GC, the third transistor T3 may diode-connect the first transistor T1. Since the first transistor T1 is diode-connected, a voltage difference corresponding to a threshold voltage of the first transistor T1 may occur between the gate terminal of the first transistor T1 and the first terminal of the first transistor T1. Accordingly, the data voltage DATA that is compensated for by the voltage difference may be provided to the gate terminal of the first transistor T1. Therefore, the third transistor T3 may compensate for the threshold voltage of the first transistor T1. For example, the third transistor T3 may be referred to as a compensation transistor.

The fourth transistor T4 may include a gate terminal, a back-gate terminal, a first terminal (i.e., a source terminal), and a second terminal (i.e., a drain terminal). The gate terminal and the back-gate terminal of the fourth transistor T4 may receive a third gate signal GI. Since the fourth transistor T4 has a dual-gate structure, reliability of the fourth transistor T4 may be improved. The first terminal of the fourth transistor T4 may receive an initialization voltage VINT. The second terminal of the fourth transistor T4 may be connected to the gate terminal of the first transistor T1. The fourth transistor T4 may be turned on or off in response to the third gate signal GI.

During a period in which the fourth transistor T4 is turned on in response to the third gate signal GI, the initialization voltage VINT may be provided to the gate terminal of the first transistor T1. Accordingly, the fourth transistor T4 may initialize the gate terminal of the first transistor T1 to the initialization voltage VINT. For example, the fourth transistor T4 may be referred to as an initialization transistor.

The fifth transistor T5 may include a gate terminal, a first terminal (i.e., a source terminal), and a second terminal (i.e., a drain terminal). The gate terminal of the fifth transistor T5 may receive an emission control signal EM. The first terminal of the fifth transistor T5 may receive the high power supply voltage ELVDD. The second terminal of the fifth transistor T5 may be connected to the first terminal of the first transistor T1. When the fifth transistor T5 is turned on in response to the emission control signal EM, the fifth transistor T5 may provide the high power supply voltage ELVDD to the first transistor T1.

The sixth transistor T6 may include a gate terminal, a first terminal (i.e., a source terminal), and a second terminal (i.e., a drain terminal). The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the light emitting part OLED. When the sixth transistor T6 is turned on in response to the emission control signal EM, the sixth transistor T6 may provide the driving current generated by the first transistor T1 to the light emitting part OLED.

The seventh transistor T7 may include a gate terminal, a first terminal (i.e., a source terminal), and a second terminal (i.e., a drain terminal). The gate terminal of the seventh transistor T7 may receive a fourth gate signal GB. The first terminal of the seventh transistor T7 may receive an anode initialization voltage AINT. The second terminal of the seventh transistor T7 may be connected to the first terminal of the light emitting part OLED. When the seventh transistor T7 is turned on in response to the fourth gate signal GB, the seventh transistor T7 may provide the anode initialization voltage AINT to the light emitting part OLED. Accordingly, the seventh transistor T7 may initialize the first terminal of the light emitting part OLED to the anode initialization voltage AINT. For example, the seventh transistor T7 may be referred to as an anode initialization transistor.

A connection structure of the pixel circuit PC and the light emitting part OLED as shown in FIG. 8 has been provided for illustrative purposes, so the connection structure may be variously changed.

Figure 15:
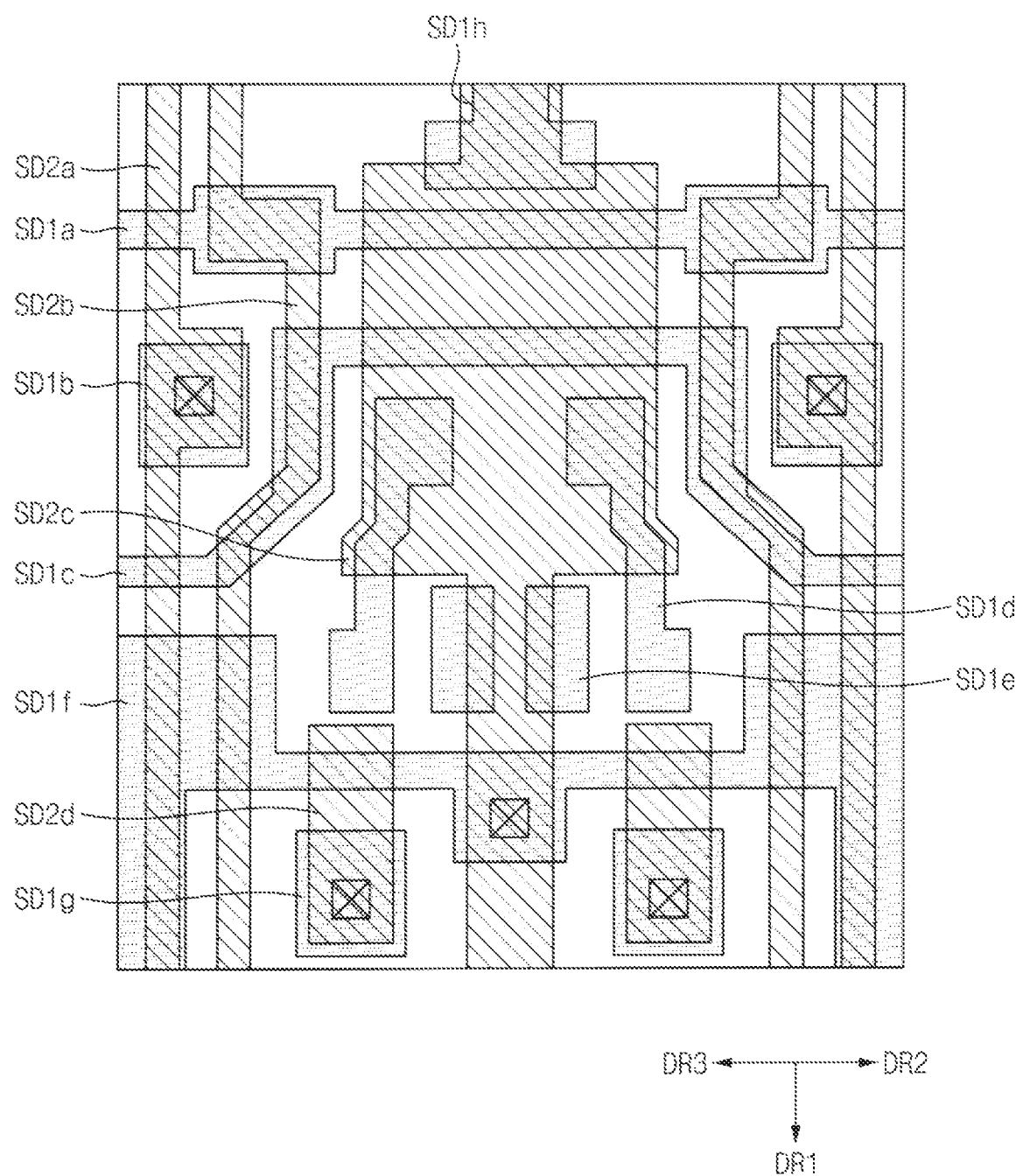
FIGS. 15 and 16 are plan views showing portions of two pixels that are adjacent to each other according to some embodiments of the present disclosure.
Figure 16:
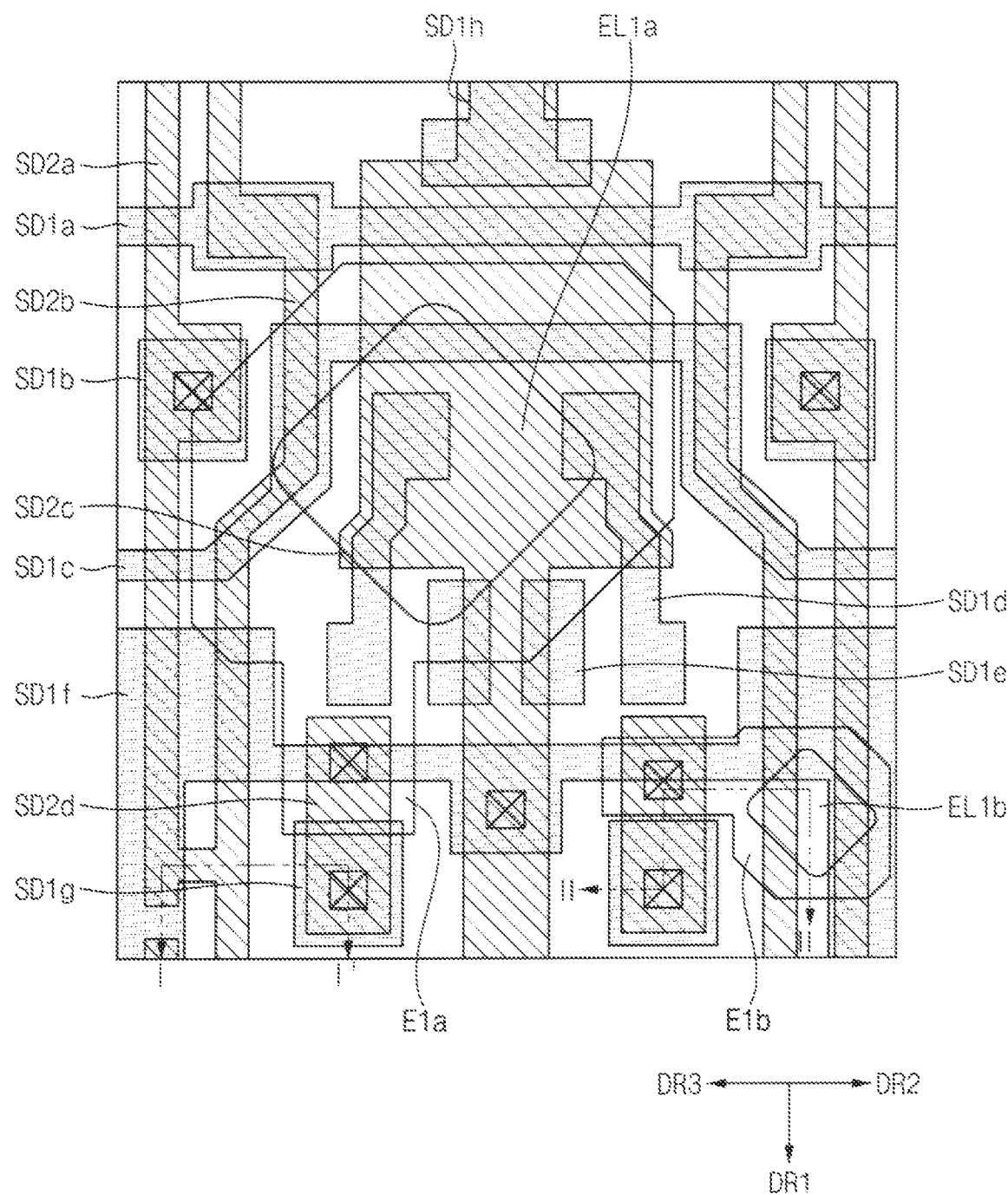
Figure 17:
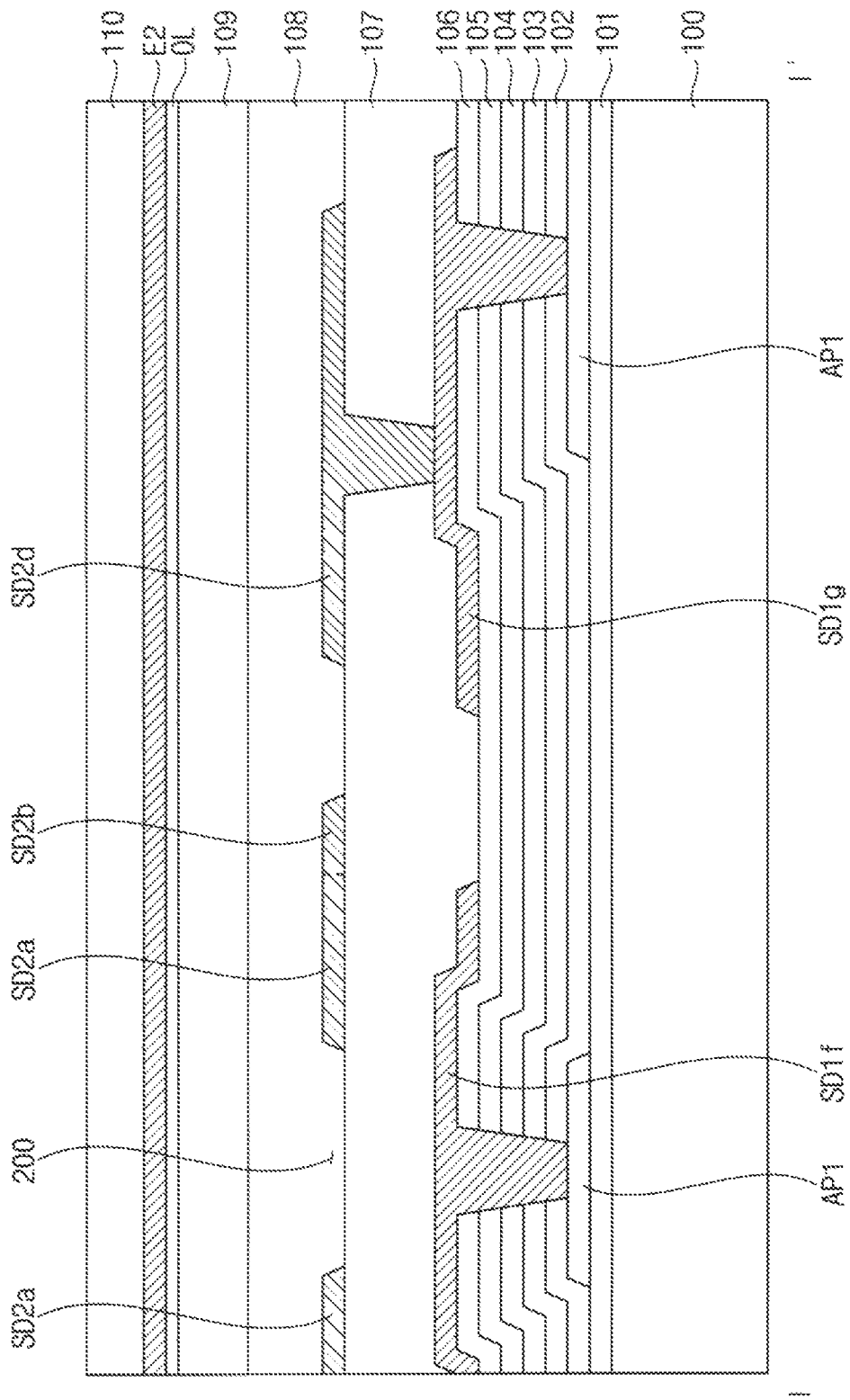
FIG. 17 is a sectional view taken along line I-I' of FIG. 16 according to some embodiments of the present disclosure.
Figure 18:
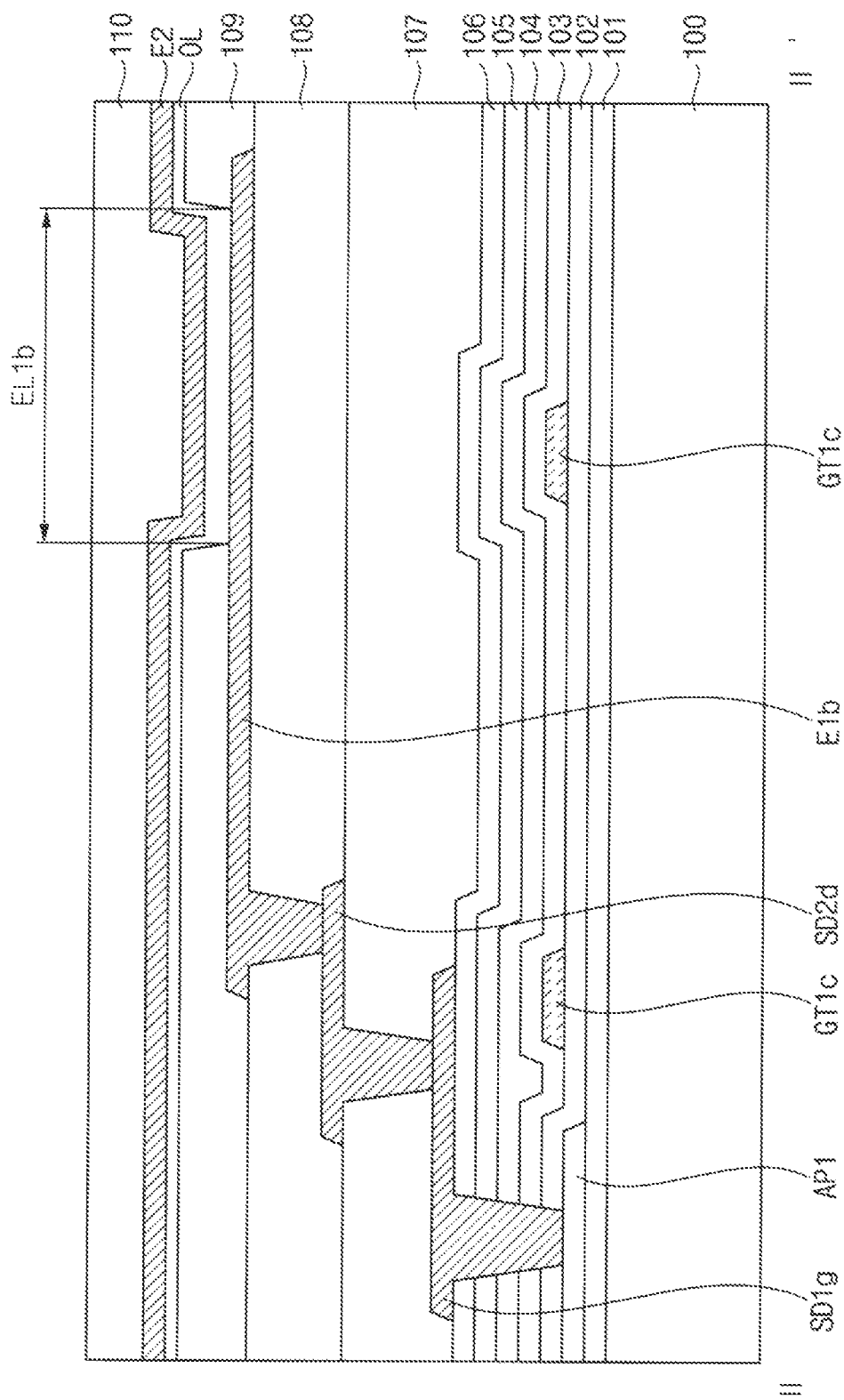
FIG. 18 is a sectional view taken along line II-IF of FIG. 16 according to some embodiments of the present disclosure.

FIGS. 9 to 14 are plan views showing portions of two pixels that are adjacent to each other according to some embodiments of the present disclosure. FIGS. 15 and 16 are plan views showing portions of two pixels that are adjacent to each other according to some embodiments of the present disclosure. FIG. 17 is a sectional view taken along line I-I' of FIG. 16. FIG. 18 is a sectional view taken along line II-IF of FIG. 16. For example, FIGS. 9 to 16 are plan views showing the pixels according to stacking steps. In order to avoid ambiguity, first to second active patterns and first to third conductive patterns have been omitted in FIGS. 13 to 17.

FIGS. 9 to 16 may show a first pixel area PX1 and a second pixel area PX2 that are adjacent to each other in the second direction DR2. For example, the first pixel area PX1 may be an area representing the second main pixel circuit C2 and the second main light emitting part L2 of FIGS. 2 to 4, and the second pixel area PX2 may be an area representing the third main pixel circuit C3 and the third main light emitting part L3 of FIGS. 2 to 4. According to some embodiments, the first pixel area PX1 and the second pixel area PX2 may have a symmetrical shape with each other in the second direction DR2.

Referring to FIGS. 8, 9, 17, and 18, a buffer layer 101 may be disposed on a substrate 100, and a first active pattern AP1 may be disposed on the buffer layer 101. A first insulating layer 102 may be disposed on the first active pattern AP1.

The substrate 100 may include or may be formed of at least one polymer film. The buffer layer 101 may include or may be formed of an inorganic material. The buffer layer 101 may block impurities from diffusing from the substrate 100.

The first active pattern AP1 may include or may be formed of a silicon semiconductor. For example, the silicon semiconductor may include or may be formed of amorphous silicon, polycrystalline silicon, or the like. Ions may be injected into the first active pattern AP1. For example, when the first, second, fifth, sixth, and seventh transistors T1, T2, T5, T6, and T7 are PMOS transistors, boron ions or the like may be injected into the first active pattern AP1.

The first insulating layer 102 may include or may be formed of an inorganic material. For example, the first insulating layer 102 may include or may be formed of silicon oxide, silicon nitride, or the like.

Referring to FIGS. 8, 10, 17, and 18, a first conductive pattern may be disposed on the first insulating layer 102. A second insulating layer 103 that covers the first conductive pattern may be disposed on the first insulating layer 102.

The first conductive pattern may include a first gate line GT1*a*, a first gate electrode pattern GT1*b*, and a second gate line GT1*c*. Portions of the first conductive pattern that overlap the first active pattern AP1 may serve as gate electrodes.

The first gate line GT1*a* may extend in the second direction DR2. The first gate line GT1*a* may constitute the second transistor T2 and the seventh transistor T7 together with the first active pattern AP1. The first gate signal GW and the fourth gate signal GB may be provided to the first gate line GT1*a*. The first gate signal GW and the fourth gate signal GB may have substantially the same waveform with a time interval therebetween. The first gate line GT1*a* may constitute the boosting capacitor CBS together with a second active pattern (AP2 of FIG. 12) that will be described below.

The first gate electrode pattern GT1*b* may be disposed in an island shape. The first gate electrode pattern GT1*b* may constitute the first transistor T1 together with the first active pattern AP1.

The second gate line GT1*c* may extend in the second direction DR2. The second gate line GT1*c* may constitute the fifth transistor T5 and the sixth transistor T6 together with the first active pattern AP1. The emission control signal EM may be provided to the second gate line GT1*c*.

The first conductive pattern may include or may be formed of metal, a metal alloy, or the like, and the second insulating layer 103 may include or may be formed of an inorganic material.

Referring to FIGS. 8, 11, 17, and 18, a second conductive pattern may be disposed on the second insulating layer 103. A third insulating layer 104 that covers the second conductive pattern may be disposed on the second insulating layer 103.

The second conductive pattern may include a third gate line GT2a, a fourth gate line GT2b, a storage capacitor electrode GT2c, and a first initialization voltage wire GT2d.

The third gate line GT2a may extend in the second direction DR2. The third gate line GT2a may be spaced apart from the first gate line GT1a in the first direction DR1 when viewed in a plan view. The third gate signal GI may be provided to the third gate line GT2a. The third gate line GT2a may overlap the second active pattern that will be described below.

The fourth gate line GT2b may extend in the second direction DR2. The fourth gate line GT2b may be disposed between the first gate line GT1a and the second gate line GT1c when viewed in a plan view. The second gate signal GC may be provided to the fourth gate line GT2b.

The storage capacitor electrode GT2c may overlap the first gate electrode pattern GT1b, and may extend in the second direction DR2. The storage capacitor electrode GT2c may constitute the storage capacitor CST together with the first gate electrode pattern GT1b. The high power supply voltage ELVDD may be provided to the storage capacitor electrode GT2c. The storage capacitor electrode GT2c may include an opening that overlaps (i.e., exposes) the first gate electrode pattern GT1b.

The first initialization voltage wire GT2d may extend in the first direction DR1. The initialization voltage VINT may be provided to the first initialization voltage wire GT2d.

The second conductive pattern may include or may be formed of metal, a metal alloy, or the like, and the third insulating layer 104 may include or may be formed of an inorganic material.

Referring to FIGS. 8, 12, 17, and 18, a second active pattern AP2 may be disposed on the third insulating layer 104. A fourth insulating layer 105 that covers the second active pattern AP2 may be disposed on the third insulating layer 104.

The second active pattern AP2 may include or may be formed of a metal oxide. For example, the second active pattern AP2 may include or may be formed of a binary compound $(AB_x)$, a ternary compound $(AB_xC_y)$, a quaternary compound $(AB_xC_yD_z)$, or the like that contains indium (In), zinc (Zn), gallium (Ga), tin (Sn), titanium (Ti), aluminum (Al), hafnium (Hf), zirconium (Zr), magnesium (Mg), or the like. For example, the second active pattern AP2 may include or may be formed of zinc oxide $(ZnO_x)$, gallium oxide $(GaO_x)$, titanium oxide $(TiO_x)$, tin oxide $(SnO_x)$, indium oxide $(InO_x)$, indium-gallium oxide (IGO), indium-zinc oxide (IZO), indium-tin oxide (ITO), gallium-zinc oxide (GZO), zinc-magnesium oxide (ZMO), zinc-tin oxide (ZTO), zinc-zirconium oxide $(ZnZr_xO_y)$, indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like.

The second active pattern AP2 may be spaced apart from the first active pattern AP1 so as not to overlap the first active pattern AP1 when viewed in a plan view. The second active pattern AP2 may continuously extend in the first pixel area PX1 and the second pixel area PX2. For example, the second active pattern AP2 may have a symmetrical shape based on an imaginary line extending in the first direction DR1, and may include a connection part CP connecting a first portion of the second active pattern AP2 disposed in the first pixel area PX1 to a second portion of the second active pattern AP2 disposed in the second pixel area PX2. The second active pattern AP2 may overlap the first gate line GT1a, the third gate line GT2a, and the fourth gate line GT2b.

The fourth insulating layer 105 may include or may be formed of an inorganic material.

Referring to FIGS. 8, 13, 17, and 18, a third conductive pattern may be disposed on the fourth insulating layer 105. A fifth insulating layer 106 that covers the third conductive pattern may be disposed on the fourth insulating layer 105.

The third conductive pattern may include a second gate electrode pattern GT3a, a fifth gate line GT3b, and a first transmission pattern GT3c.

The second gate electrode pattern GT3a may overlap the third gate line GT2a and the second active pattern AP2. The second gate electrode pattern GT3a may be electrically connected to the third gate line GT2a. For example, the second gate electrode pattern GT3a may contact the third gate line GT2a through a contact hole formed through the fourth insulating layer 105. The third gate signal GI may be provided to the second gate electrode pattern GT3a. A portion of the second gate electrode pattern GT3a that overlaps the second active pattern AP2 may be the gate terminal of the fourth transistor T4, and a portion of the third gate line GT2a that overlaps the second active pattern AP2 may be the back-gate terminal of the fourth transistor T4.

The fifth gate line GT3b may extend in the second direction DR2. The fifth gate line GT3b may overlap the fourth gate line GT2b and the second active pattern AP2. The second gate signal GC may be provided to the fifth gate line GT3b. A portion of the fourth gate line GT2b that overlaps the second active pattern AP2 may be the back-gate terminal of the third transistor T3, and a portion of the fifth gate line GT3b that overlaps the second active pattern AP2 may be the gate terminal of the third transistor T3.

The first transmission pattern GT3c may contact the first gate electrode pattern GT1b exposed by the opening of the storage capacitor electrode GT2c. The first transmission pattern GT3c may be electrically connected to the drain terminal of the fourth transistor T4 to transmit the initialization voltage VINT to the first gate electrode pattern GT1b.

The third conductive pattern may include or may be formed of metal, a metal alloy, or the like, and the fifth insulating layer 106 may include an inorganic material.

Referring to FIGS. 8, 14, 17, and 18, a fourth conductive pattern may be disposed on the fifth insulating layer 106. A sixth insulating layer 107 that covers the fourth conductive pattern may be disposed on the fifth insulating layer 106.

The fourth conductive pattern may include a horizontal transmission wire SD1a, a second transmission pattern SD1b, a second initialization voltage wire SD1c, a third transmission pattern SD1d, a fourth transmission pattern SD1e, a fifth transmission pattern SD1f, a sixth transmission pattern SD1g, and a seventh transmission pattern SD1h.

The horizontal transmission wire SD1a may extend in the second direction DR2. In one region, the horizontal transmission wire SD1a may contact a data line (SD2a of FIG. 15) that will be described below. In one region, the horizontal transmission wire SD1a may contact a vertical transmission wire (SD2b of FIG. 15) that will be described below.

The second transmission pattern SD1b may contact the first active pattern AP1. The second transmission pattern SD1b may contact the data line (SD2a of FIG. 15) to transmit the data voltage DATA to the first active pattern AP1.

The second initialization voltage wire SD1c may extend in the second direction DR2. The anode initialization voltage AINT may be provided to the second initialization voltage wire SD1c. The second initialization voltage wire SD1c may contact the first active pattern AP1, and the anode initialization voltage AINT may be transmitted to the first active pattern AP1.

The third transmission pattern SD1d may contact the second active pattern AP2 and the first transmission pattern GT3c. The initialization voltage VINT may be transmitted to the first gate electrode pattern GT1b through the first initialization voltage wire GT2d, the second active pattern AP2, the third transmission pattern SD1d, and the first transmission pattern GT3c.

The fourth transmission pattern SD1e may contact the second active pattern AP2 and the first active pattern AP1. The fourth transmission pattern SD1e may electrically connect the second active pattern AP2 to the first active pattern AP1.

The fifth transmission pattern SD1f may extend in the second direction DR2. The high power supply voltage ELVDD may be provided to the fifth transmission pattern SD1f. The fifth transmission pattern SD1f may contact the first active pattern AP1 to transmit the high power supply voltage ELVDD to the first active pattern AP1. The fifth transmission pattern SD1f may contact the storage capacitor electrode GT2c to transmit the high power supply voltage ELVDD to the storage capacitor electrode GT2c.

The sixth transmission pattern SD1g may contact the first active pattern AP1. The sixth transmission pattern SD1g may transmit the driving current generated by the first transistor T1 or the anode initialization voltage AINT to the light emitting part OLED.

The seventh transmission pattern SD1h may contact the second active pattern AP2 and the first initialization voltage wire GT2d. The seventh transmission pattern SD1h may transmit the initialization voltage VINT to the second active pattern AP2.

The fourth conductive pattern may include or may be formed of metal, a metal alloy, or the like, and the sixth insulating layer 107 may include or may be formed of an organic material. For example, the sixth insulating layer 107 may include or may be formed of a phenol resin, an acryl resin, a polyimide resin, or the like.

Referring to FIGS. 8, 15, 17, and 18, a fifth conductive pattern may be disposed on the sixth insulating layer 107. A seventh insulating layer 108 that covers the fifth conductive pattern may be disposed on the sixth insulating layer 107.

The fifth conductive pattern may include a data line SD2a, a vertical transmission wire SD2b, a power supply wire SD2c, and an eighth transmission pattern SD2d.

The data line SD2a may extend in the first direction DR1. The data voltage DATA may be transmitted to the first active pattern AP1 through the data line SD2a and the second transmission pattern SD1b. In one region, the data line SD2a may include a disconnection part 200 (i.e., an empty region). For example, the data line SD2a may be provided in plural. Two or more data lines SD2a may be physically separated from each other in the first direction DR1 with the disconnection part 200 therebetween. In one region, the data line SD2a may contact the vertical transmission wire SD2b.

The vertical transmission wire SD2b may extend in the second direction DR2. In one region, the vertical transmission wire SD2b may correspond to the bridge line BL of FIG. 1. In one region, the vertical transmission wire SD2b may contact the horizontal transmission wire SD1a. For example, a first data voltage may be transmitted to the first active pattern AP1 through the data line SD2a, and a second data voltage that is different from the first data voltage may be transmitted to the horizontal transmission wire SD1a and another data line (not shown) through the vertical transmission wire SD2b.

The eighth transmission pattern SD2d may contact the sixth transmission pattern SD1g. The eighth transmission pattern SD2d may transmit the driving current or the anode initialization voltage AINT from the sixth transmission pattern SD1g to the light emitting part OLED.

The fifth conductive pattern may include or may be formed of metal, a metal alloy, or the like, and the seventh insulating layer 108 may include or may be formed of an organic material.

Referring to FIGS. 8, 16, 17, and 18, individual electrode patterns and a pixel defining layer 109 including an opening that exposes a portion of the individual electrode pattern may be disposed on the seventh insulating layer 108. An organic layer OL that covers the pixel defining layer 109 and the individual electrode pattern exposed by the opening may be disposed on the pixel defining layer 109. A common electrode E2 may be disposed on the organic layer OL. An encapsulation layer 110 may be disposed on the common electrode E2.

The individual electrode pattern may include a first electrode pattern E1a and a second electrode pattern E1b. In some embodiments, the first electrode pattern E1a and the second electrode pattern E1b may be physically separated from each other. For the convenience of description, two electrode patterns E1a and E1b are shown. In some embodiments, each pixel may have an individual electrode pattern physically separated from another individual electrode pattern of another pixel. The first electrode pattern E1a and the second electrode pattern E1b may be collectively referred to as an anode electrode.

The pixel defining layer 109 may include the opening that overlaps (i.e., exposes) at least a portion of the individual electrode pattern. The pixel defining layer 109 may include or may be formed of an organic material.

The organic layer OL may include at least one light emitting layer. The organic layer OL may further include at least one functional layer among an auxiliary layer, a hole injection layer, a hole transport layer, and an electron injection layer.

The common electrode E2 may include or may be formed of metal, a metal alloy, or the like. The common electrode E2 may be referred to as a cathode electrode.

The individual electrode pattern, the organic layer OL, and the second electrode E2 may overlap each other, and a portion of the individual electrode pattern and a portion of the organic layer OL contact each other within the opening of the pixel defining layer 109 to form a light emitting part. For example, the portion of the individual electrode pattern and the portion of the organic layer OL contacting each other in the opening of the pixel defining layer 109 may be defined as a light emitting part. For example, the second electrode pattern E1b of the individual electrode pattern, the organic layer OL, and the common electrode E2 may overlap each other, and a portion in which the second electrode pattern E1b and the organic layer OL within the opening of the pixel defining layer 109 may be defined as a second light emitting part EL1b.

Figure 9:
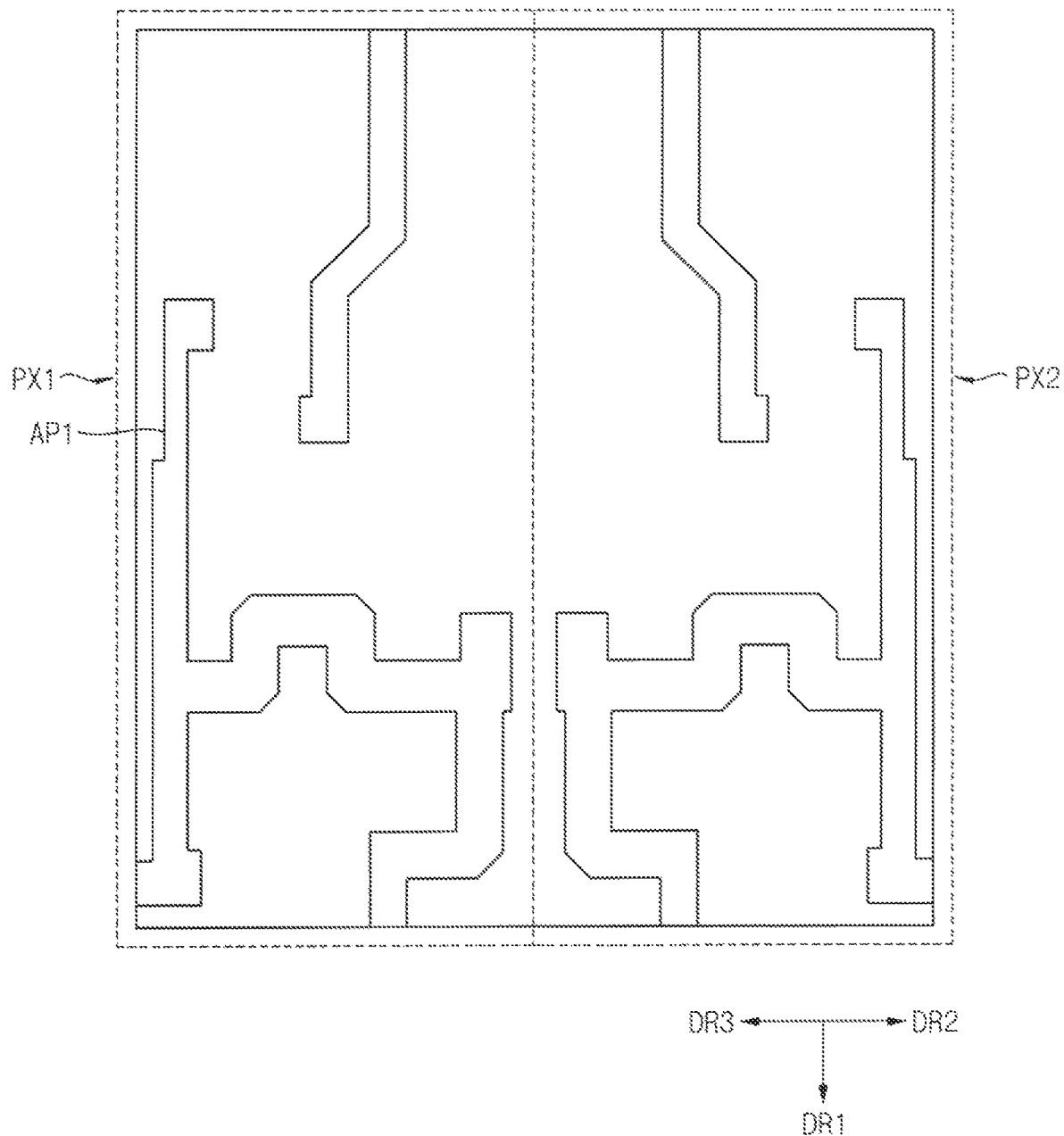
FIGS. 9 to 14 are plan views showing portions of two pixels that are adjacent to each other according to some embodiments of the present disclosure.
Figure 10:
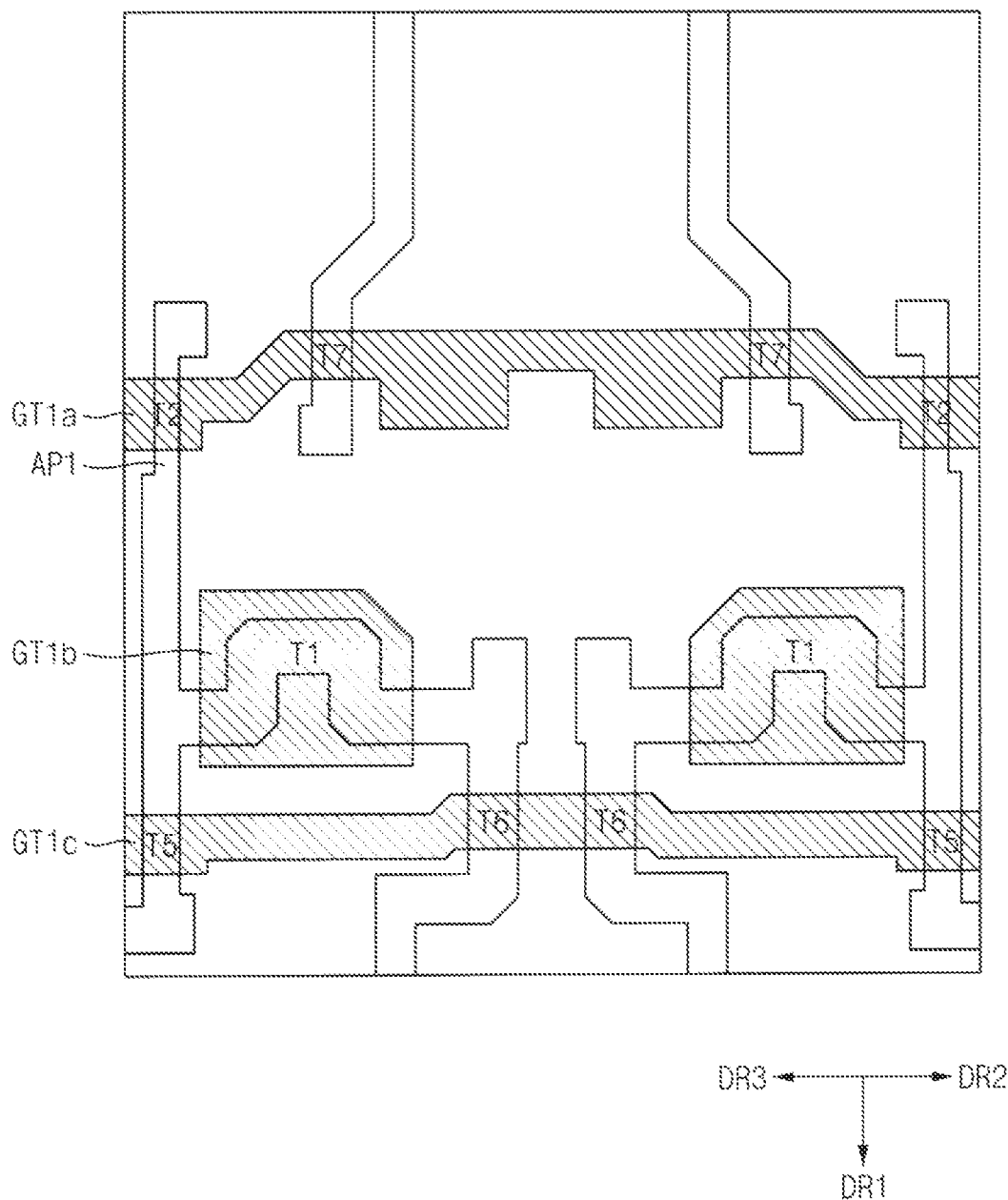
Figure 11:
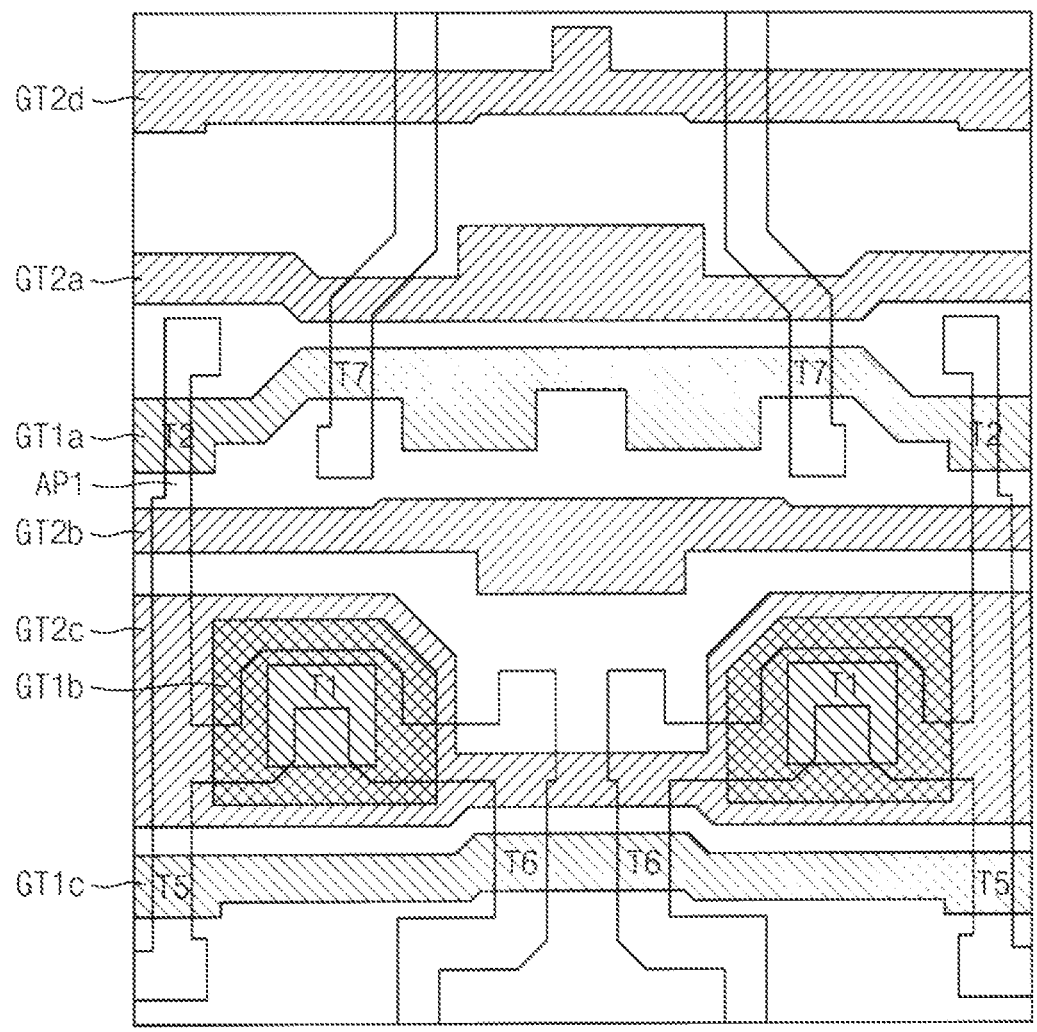
Figure 11:
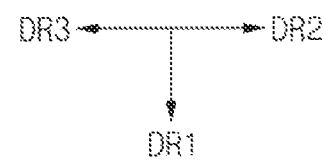
Figure 12:
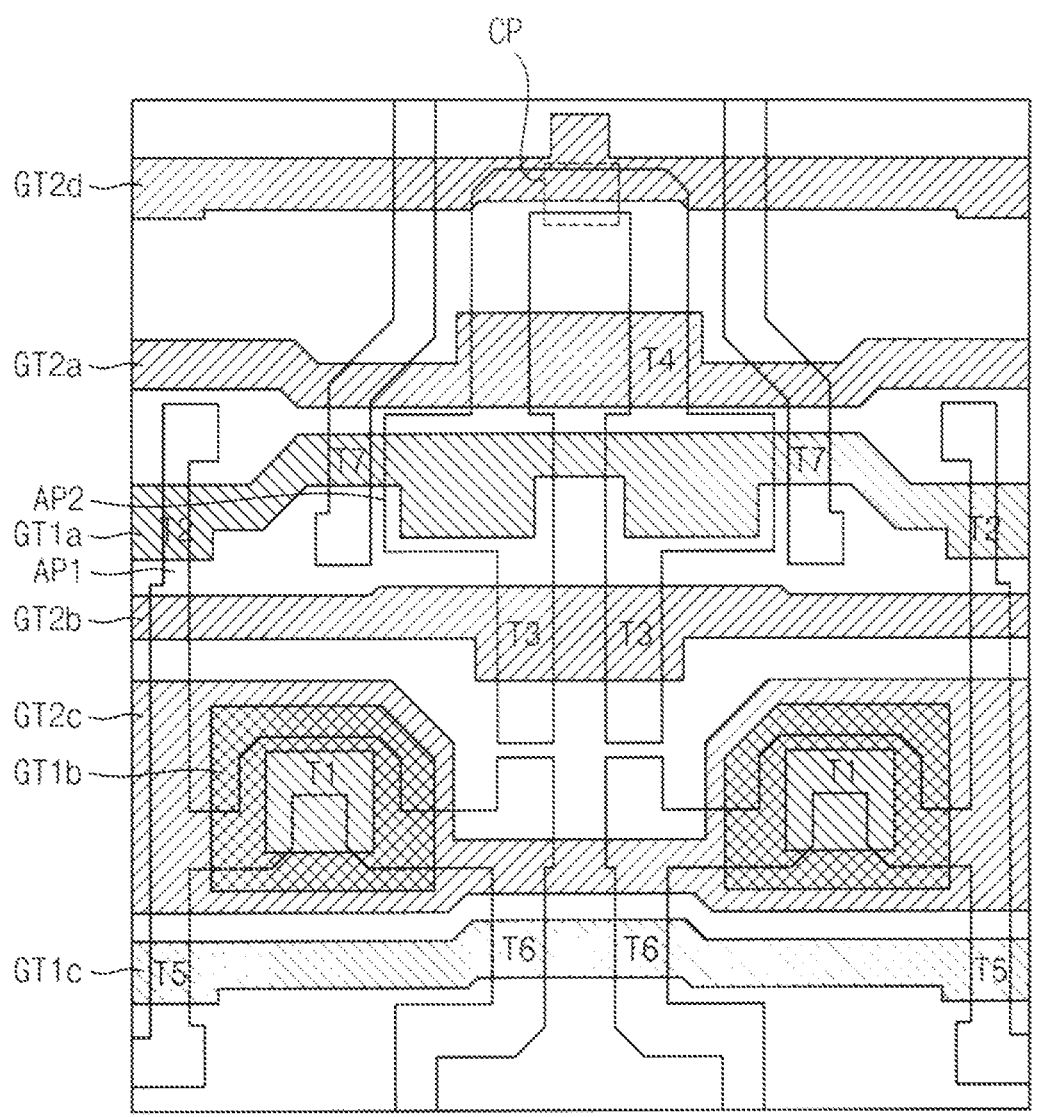
Figure 12:
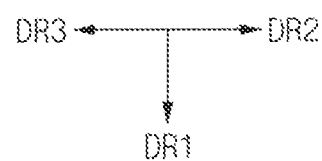
Figure 13:
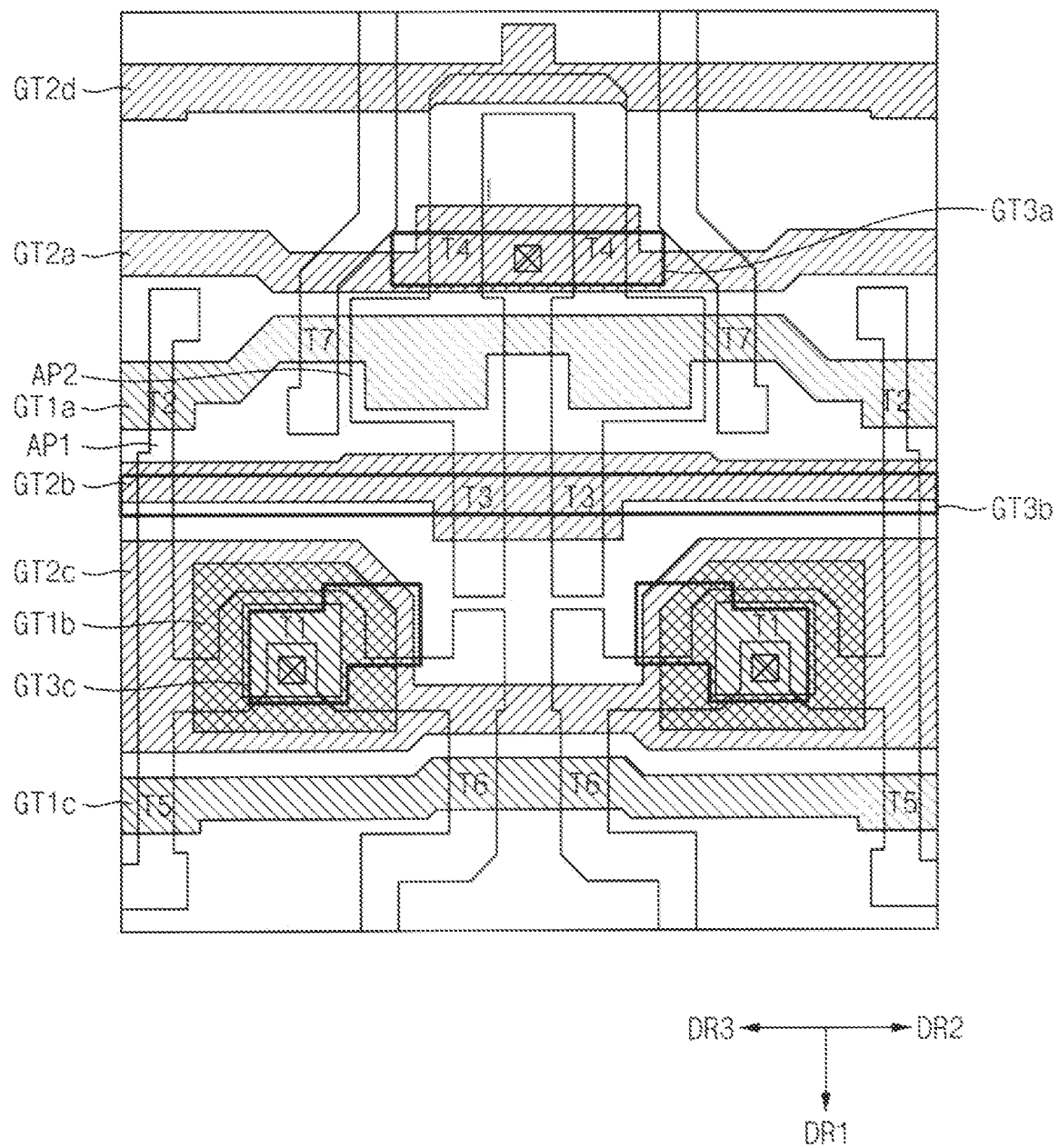
Figure 14:
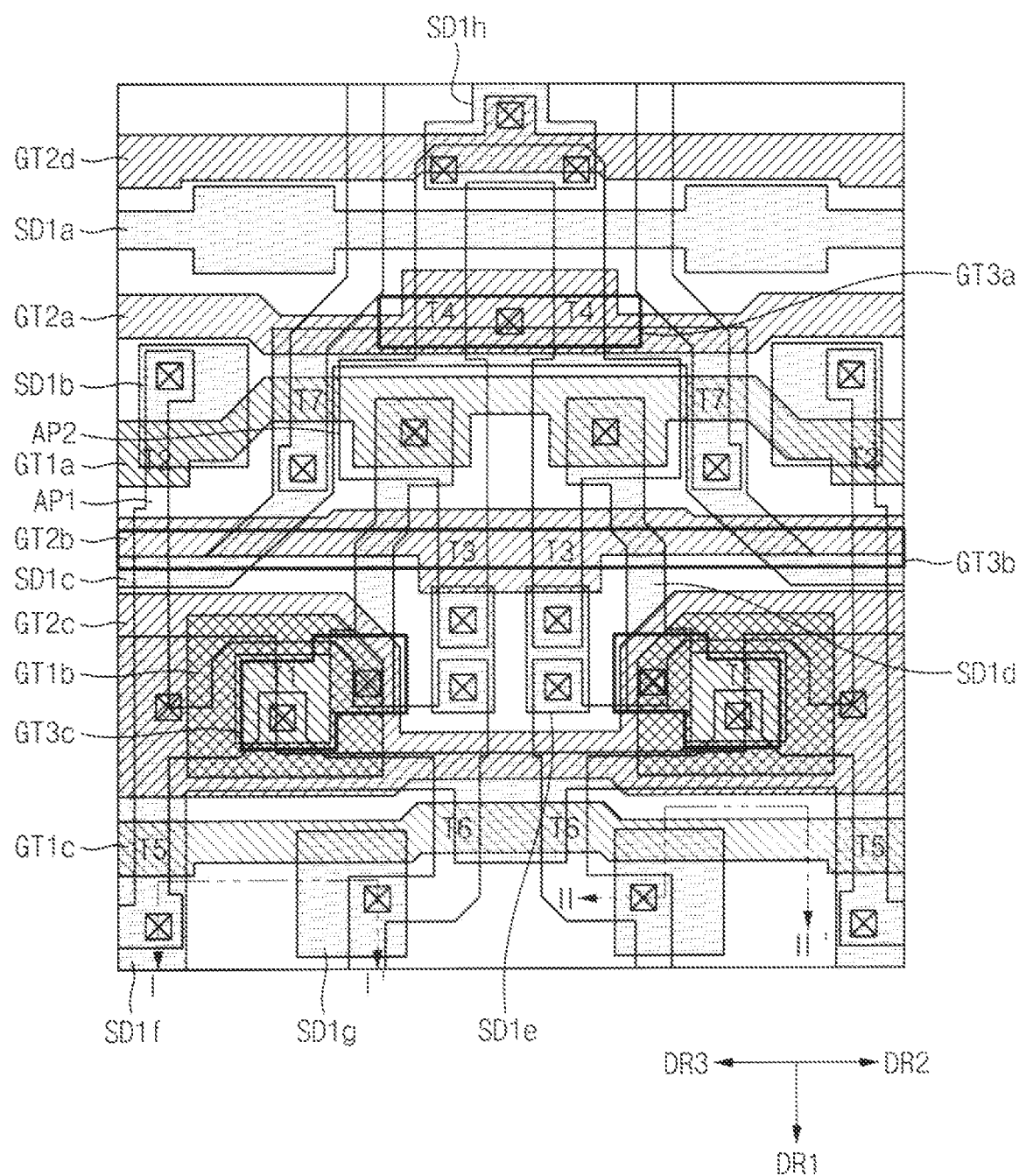

According to some embodiments, at least a portion of a first light emitting part EL1a may overlap the first pixel area (PX1 of FIG. 9), and at least a portion of the second light emitting part EL1b may overlap the second pixel area (PX2 of FIG. 9). For example, the first light emitting part EL1a of FIG. 16 may be the second main light emitting part L2 of FIG. 3, and the second light emitting part EL1b of FIG. 16 may be the third main light emitting part L3 of FIG. 3.

Figure 19:
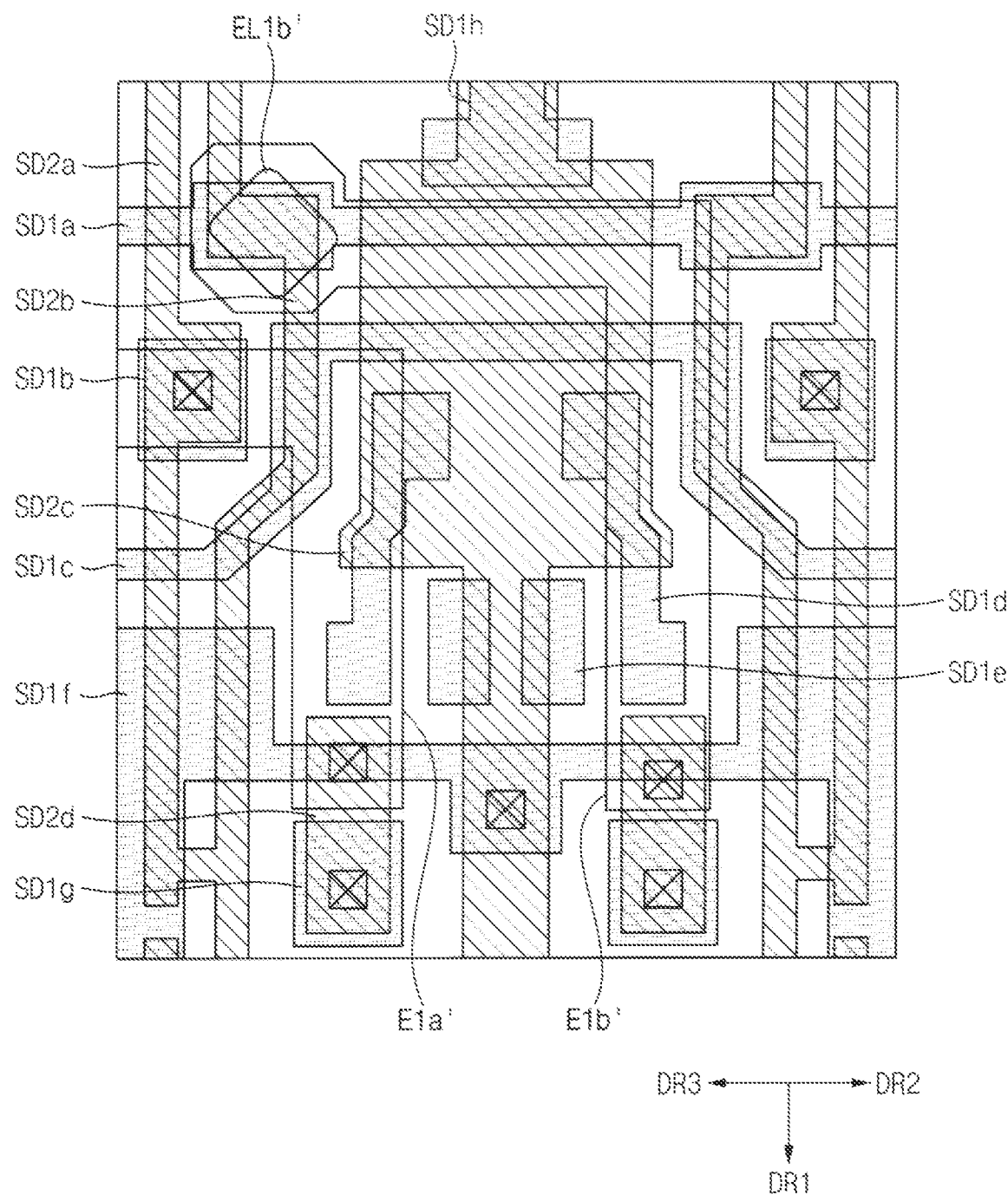
FIG. 19 is a plan view showing portions of two pixels that are adjacent to each other according to some embodiments of the present disclosure.

FIG. 19 is a plan view showing portions of two pixels that are adjacent to each other according to some embodiments of the present disclosure. For example, FIG. 19 may be a plan view showing the third sub-pixel circuit SC3, the fourth sub-pixel circuit SC4, and the fourth sub-light emitting part SL4 of FIGS. 5 to 7. Redundant descriptions of the configuration of FIG. 16 will be omitted.

Referring to FIG. 19, the second light emitting part EL1b' may not overlap the second pixel area (PX2 of FIG. 9). For example, at least a portion of the second light emitting part EL1b' may overlap the first pixel area (PX1 of FIG. 9). For example, the second light emitting part EL1b' of FIG. 19 may represent the fourth sub-light emitting part SL4 of FIG. 5.

Although exemplary embodiments of the present disclosure have been described above, it will be understood by those of ordinary skill in the art that various changes and modifications can be made to the present disclosure without departing from the idea and scope of the present disclosure as set forth in the appended claims.

The present invention may be applied to various display devices. For example, the present invention may be applied to various display devices such as display devices for vehicles, ships, and aircraft, portable communication devices, display devices for exhibition or information transmission, and medical display devices.

What is claimed is:

1. A display device comprising:
a main light emitting part;
a first sub-light emitting part spaced apart from the main light emitting part in a first direction;
a main pixel circuit connected to the main light emitting part, and overlapping at least a portion of the main light emitting part;
a first sub-pixel circuit, without overlapping the first sub-light emitting part, connected to the first sub-light emitting part, and spaced apart from the first sub-light emitting part in a second direction that is perpendicular to the first direction, wherein the first direction and the second direction extend along a same plane;
a main data line extending in the first direction, and connected to the main pixel circuit;
a first sub-data line extending in the first direction, and connected to the first sub-pixel circuit; and
a first bridge line connecting the main data line to the first sub-data line.

2. The display device of claim 1,
wherein the first bridge line includes:
a first vertical bridge line connected to the main data line, and extending in the first direction; and
a first horizontal bridge line connecting the first vertical bridge line to the first sub-data line, and extending in the second direction.

3. The display device of claim 2,
wherein a portion of the first vertical bridge line overlaps the main pixel circuit.

4. The display device of claim 1,
wherein a portion of the main data line overlaps the main pixel circuit, and
wherein a portion of the first sub-data line overlaps the first sub-pixel circuit.

5. The display device of claim 4,
wherein a first distance from the main light emitting part to the main data line is smaller than a second distance from the first sub-light emitting part to the first sub-data line.

6. The display device of claim 1,
wherein a same data voltage is applied to the main data line and the first sub-data line.

7. The display device of claim 1, further comprising:
a second sub-light emitting part spaced apart from the first sub-light emitting part in the first direction;
a second sub-pixel circuit, without overlapping the second sub-light emitting part, connected to the second sub-light emitting part, and spaced apart from the second sub-light emitting part in the second direction;
a second sub-data line extending in the first direction, and connected to the second sub-pixel circuit; and
a second bridge line connecting the first sub-data line to the second sub-data line.

8. The display device of claim 7,
wherein the second bridge line extends in the second direction, and is connected to each of the first sub-data line and the second sub-data line.

9. The display device of claim 7,
wherein a same data voltage is applied to the main data line, the first sub-data line, and the second sub-data line.

10. The display device of claim 7,
wherein a second distance from the first sub-light emitting part to the first sub-data line is smaller than a third distance from the second sub-light emitting part to the second sub-data line.

11. The display device of claim 1, further comprising:
a third sub-pixel circuit overlapping at least a portion of the first sub-light emitting part;
a third sub-light emitting part, without overlapping the third sub-pixel circuit, connected to the third sub-pixel circuit, and spaced apart from the first sub-light emitting part in a third direction that is opposite to the second direction; and
a third sub-data line extending in the first direction, and connected to the third sub-pixel circuit.

12. The display device of claim 11,
wherein the third sub-data line is spaced apart from the main data line in the first direction.

13. The display device of claim 11,
wherein a first data voltage is applied to the first sub-data line, and
wherein a second data voltage that is different from the first data voltage is applied to the third sub-data line.

14. The display device of claim 11,
wherein a portion of the third sub-data line overlaps the third sub-pixel circuit.

15. A display device comprising:
a first sub-light emitting part;
a second sub-light emitting part spaced apart from the first sub-light emitting part in a first direction;
a first sub-pixel circuit, without overlapping the first sub-light emitting part, connected to the first sub-light emitting part, and spaced apart from the first sub-light emitting part in a second direction that is perpendicular to the first direction;
a second sub-pixel circuit, without overlapping the second sub-light emitting part, connected to the second sub-light emitting part, and spaced apart from the second sub-light emitting part in the second direction;

a first sub-data line extending in the first direction, and connected to the first sub-pixel circuit;

a second sub-data line extending in the first direction, and connected to the second sub-pixel circuit; and a first bridge line connecting the first sub-data line to the second sub-data line.

16. The display device of claim 15,
wherein the first sub-light emitting part does not overlap the first sub-pixel circuit.

17. The display device of claim 15,
wherein a portion of the first sub-data line overlaps the first sub-pixel circuit, and
wherein a portion of the second sub-data line overlaps the second sub-pixel circuit.

18. The display device of claim 17,
wherein a first distance from the first sub-light emitting part to the first sub-data line is smaller than a second distance from the second sub-light emitting part to the second sub-data line.

19. The display device of claim 15, further comprising:

a third sub-light emitting part spaced apart from the second sub-light emitting part in the first direction;

a third sub-pixel circuit, without overlapping the third sub-light emitting part, connected to the third sub-light emitting part, and spaced apart from the third sub-light emitting part in the second direction;

a third sub-data line extending in the first direction, and connected to the third sub-pixel circuit; and a second bridge line connecting the second sub-data line to the third sub-data line.

20. The display device of claim 19,
wherein a second distance from the second sub-light emitting part to the second sub-data line is smaller than a third distance from the third sub-light emitting part to the third sub-data line.

* * * * *